(12) United States Patent
Ono et al.

(10) Patent No.: US 6,436,783 B1
(45) Date of Patent: Aug. 20, 2002

(54) METHOD OF FORMING MOS TRANSISTOR

(75) Inventors: Atsuki Ono; Nobuaki Hamanaka, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/664,059

(22) Filed: Sep. 18, 2000

(30) Foreign Application Priority Data

Sep. 17, 1999 (JP) .......................................... 11-263571
May 25, 2000 (JP) ....................................... 2000-155333

(51) Int. Cl.[7] ........................................... H01L 21/331
(52) U.S. Cl. ..................................... 438/366; 438/232
(58) Field of Search ........................ 438/366, 300–307, 438/199, 139, 233, 232, 229, 299, 515, 516, 530

(56) References Cited

U.S. PATENT DOCUMENTS 5,940,699 A * 8/1999 Sumi et al. ................. 438/233
6,069,046 A * 5/2000 Gardner et al. ............. 438/305
6,261,889 B1 * 7/2001 Ono ........................... 438/232

* cited by examiner

Primary Examiner—Hoai V. Ho
Assistant Examiner—David Vu
(74) Attorney, Agent, or Firm—Young & Thompson

(57) ABSTRACT

(issue) It is an issue to suppress variation in threshold voltage due to deterioration in shot channel characteristics and improve the slow trap characteristics of the MOS transistor for suppressing variation in threshold voltage of the transistor for a long-term use.

(means for solving the issue) fluorine ions are implanted into a surface of a silicon substrate 1 but a peripheral region of a gate electrode on a p-MOS formation region. A first heat treatment is carried out for removing inter-lattice silicon atoms generated upon ion-implantation. Thereafter, a second heat treatment is carried out for diffusing fluorine ions into a region directly under the gate electrode. The first heat treatment is a lamp anneal such as RTA, and the second heat treatment is a furnace anneal.

12 Claims, 25 Drawing Sheets

(p-MOS formation region)

(n-MOS formation region)

(FIG. 1)
(p-MOS formation region)　　　(n-MOS formation region)
(a)
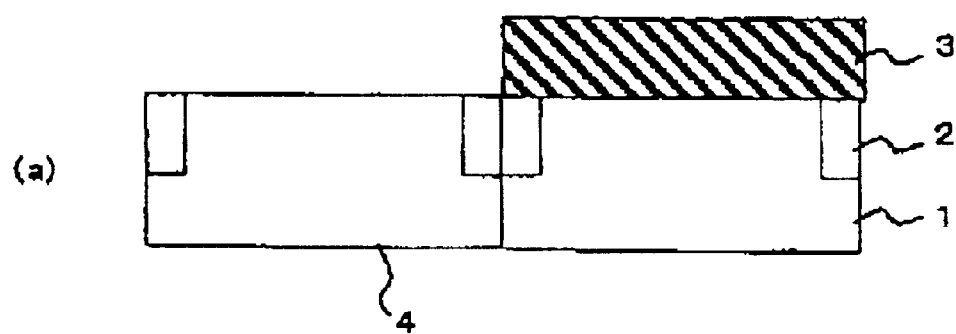
(b)
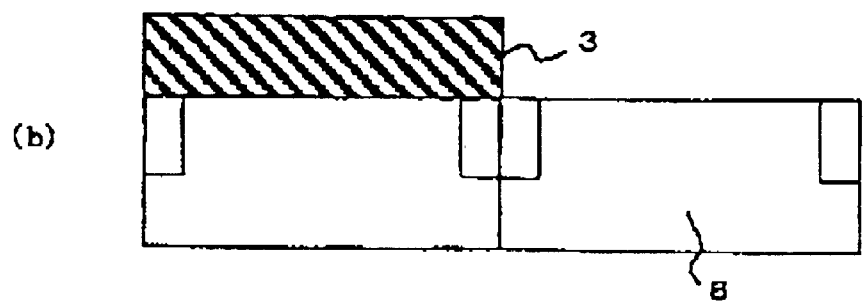
(c)
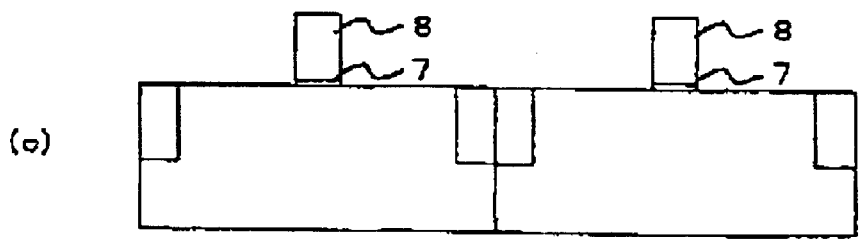

(FIG. 2)
(p-MOS formation region)    (n-MOS formation region)
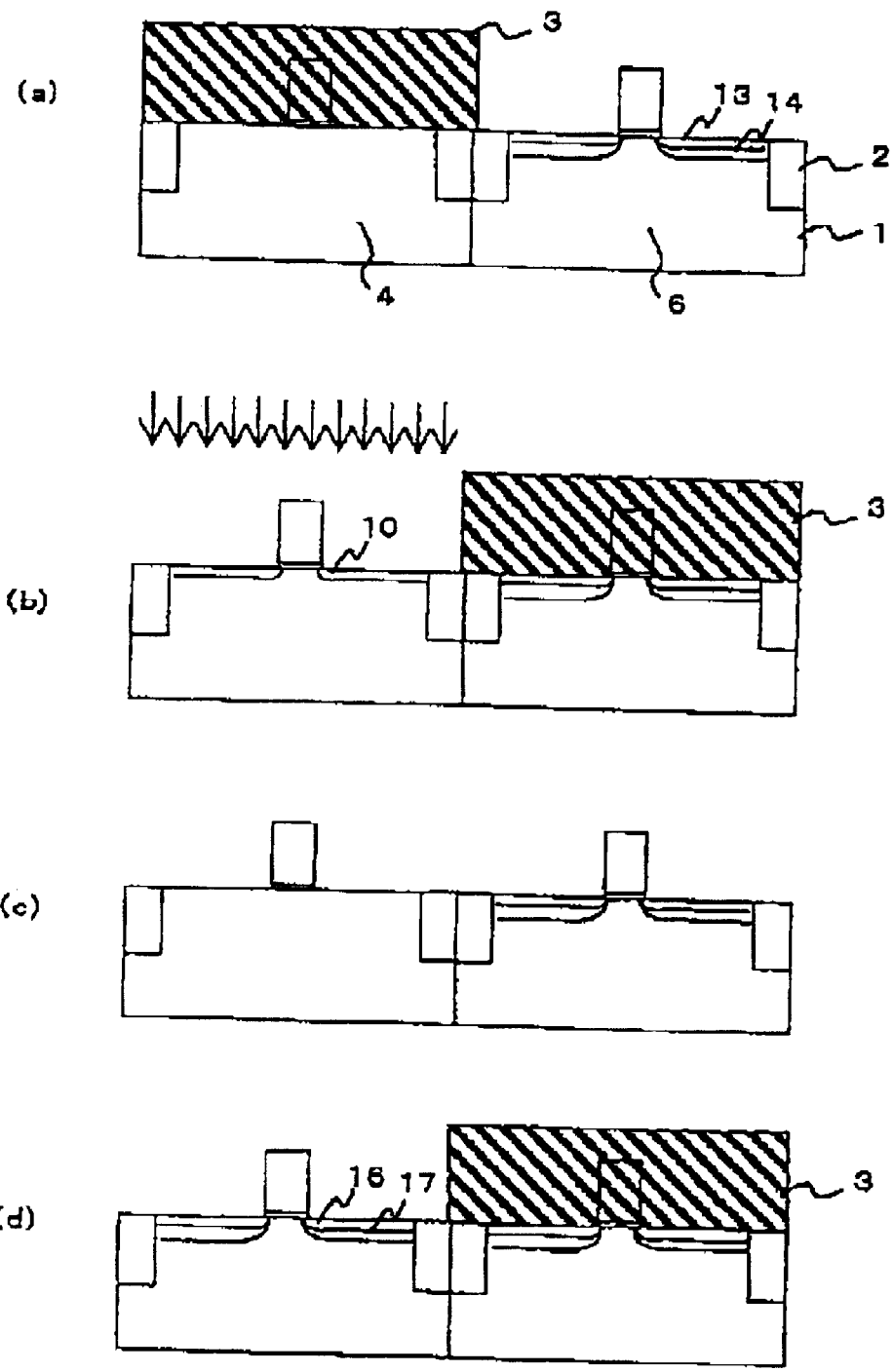

(FIG. 3)
(p-MOS formation region)    (n-MOS formation region)
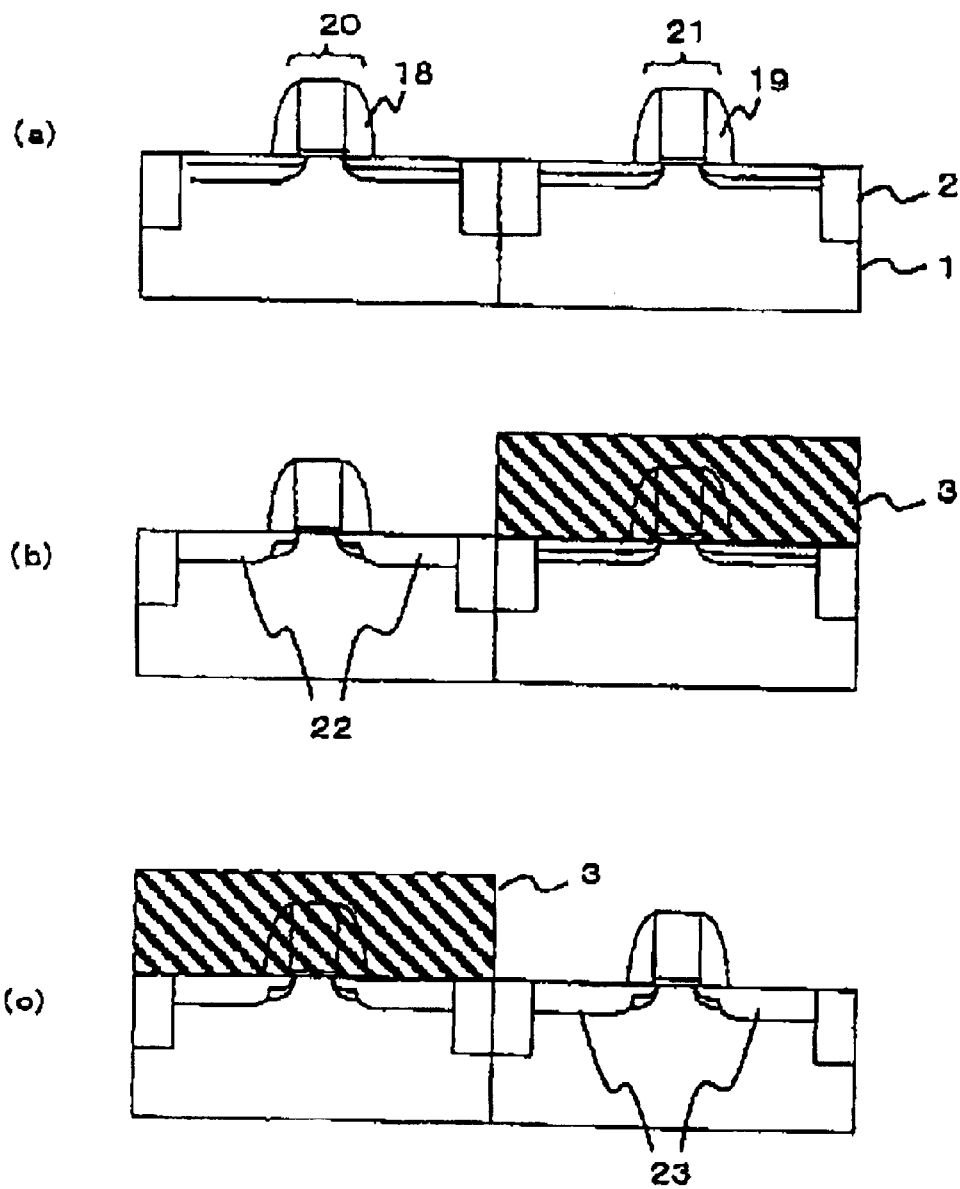

(FIG. 4)
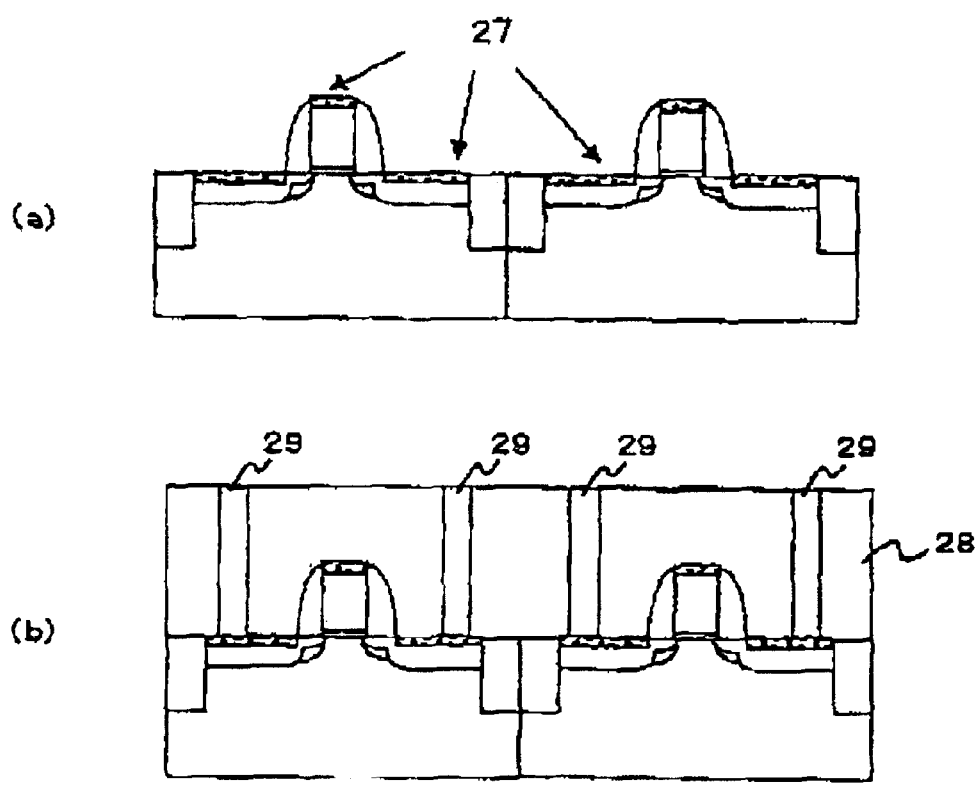

(FIG. 5)
(p-MOS formation region)　　　　(n-MOS formation region)
(a)
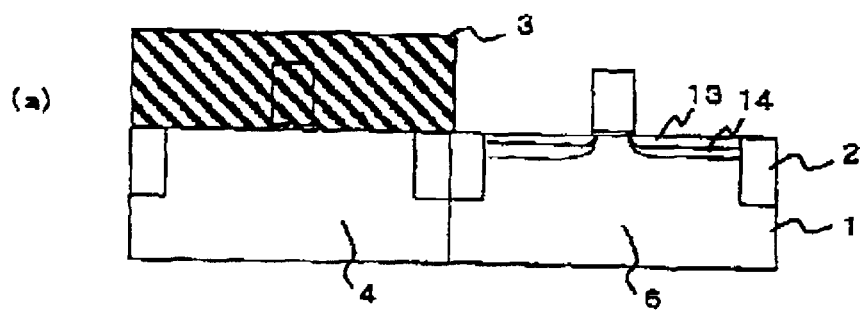
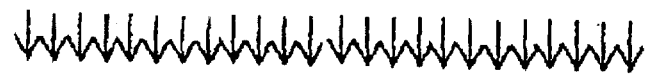
(b)
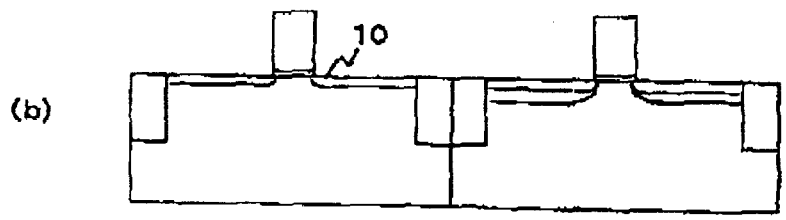
(c)
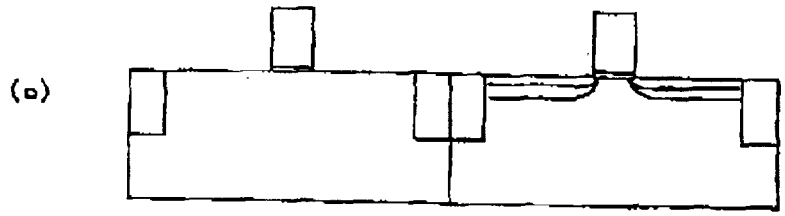
(d)
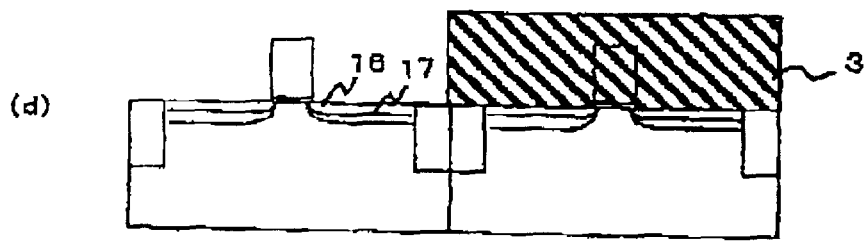

(FIG. 6)
(p-MOS formation region)      (n-MOS formation region)
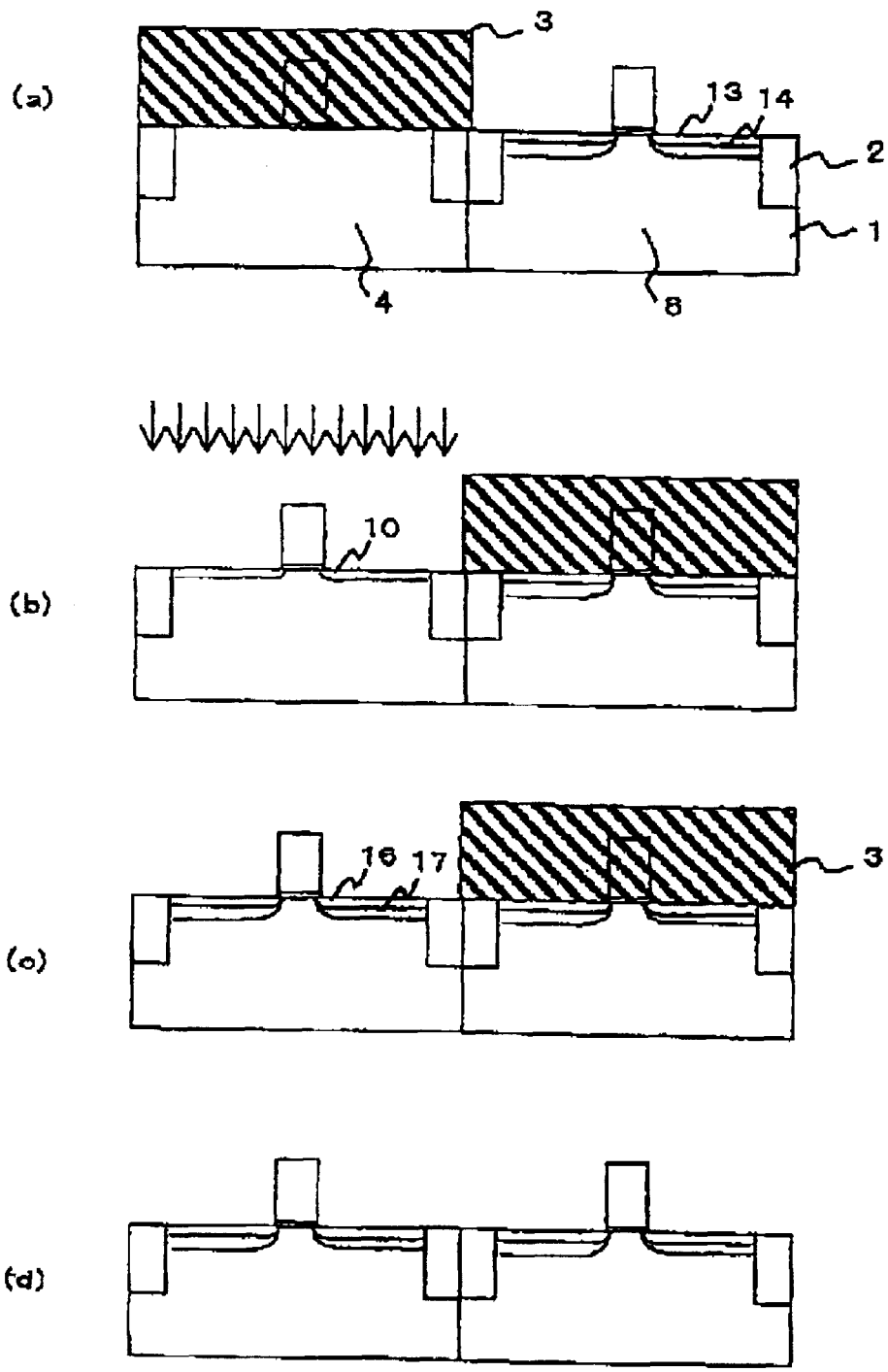

(FIG. 7)
(p-MOS formation region)　　　　(n-MOS formation region)
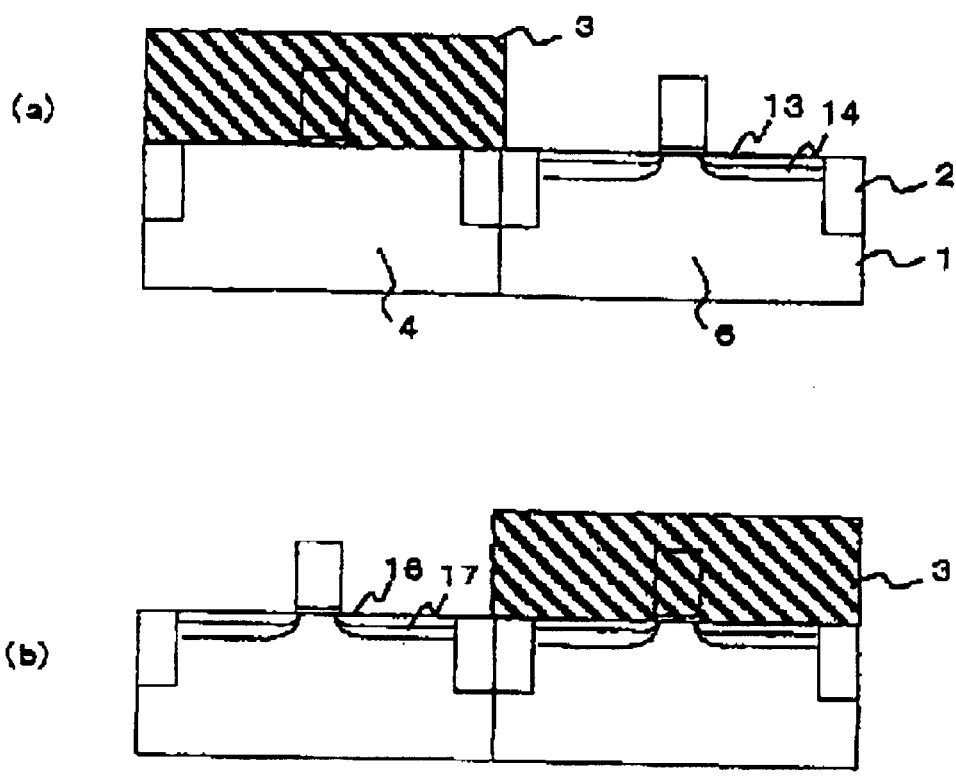

(FIG. 8)
(p-MOS formation region)　　　　(n-MOS formation region)
(a)
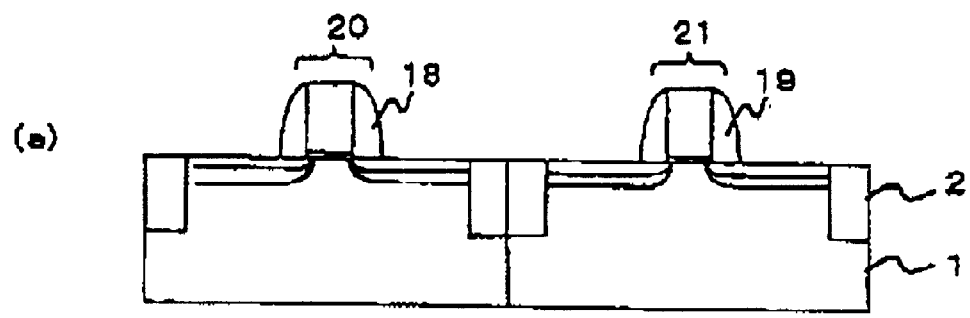
(b)
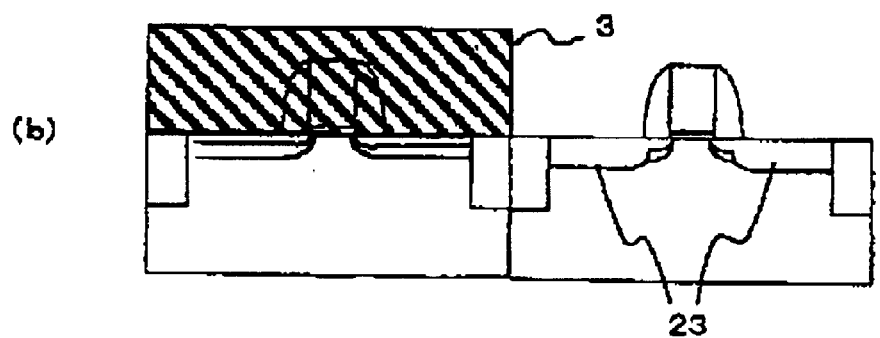
(c)
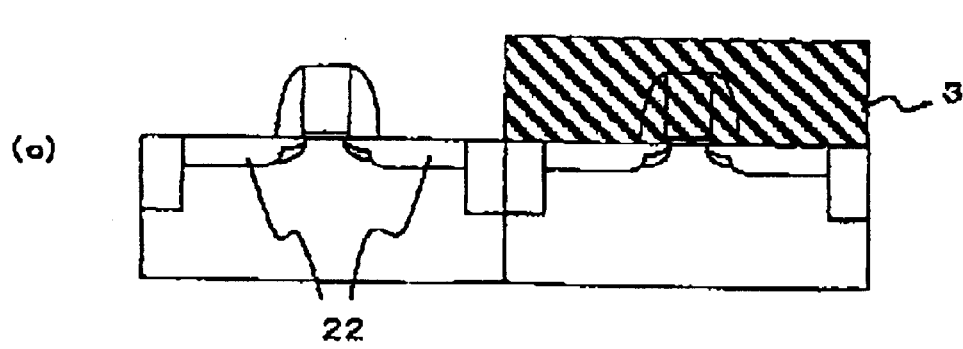

(FIG. 9)
(p-MOS formation region)    (n-MOS formation region)
(a) 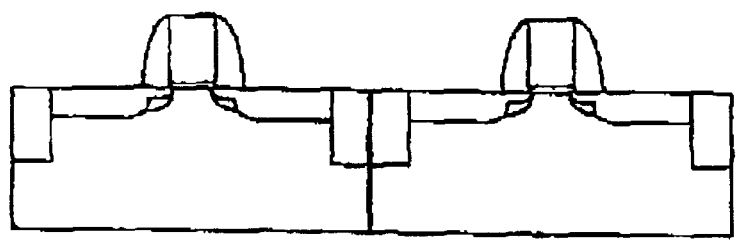
(b) 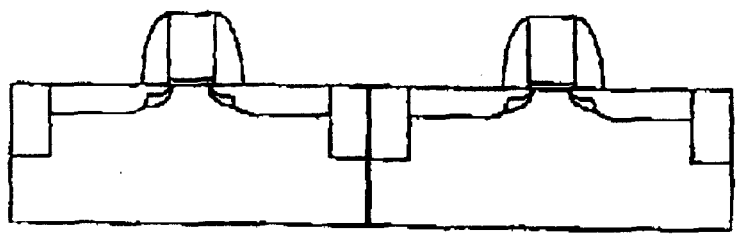

(FIG. 10)
(p-MOS formation region)   (n-MOS formation region)
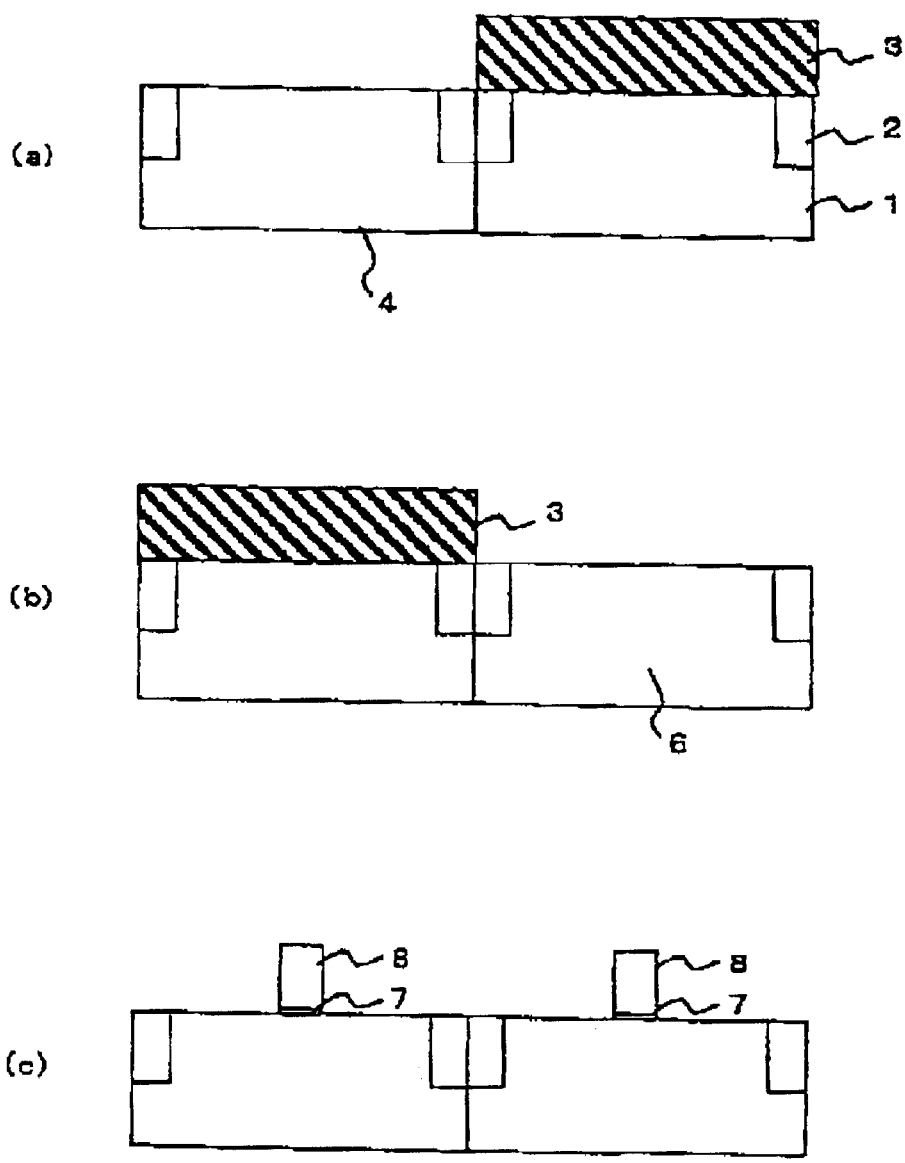

(FIG. 11)
(p-MOS formation region)   (n-MOS formation region)
(a)
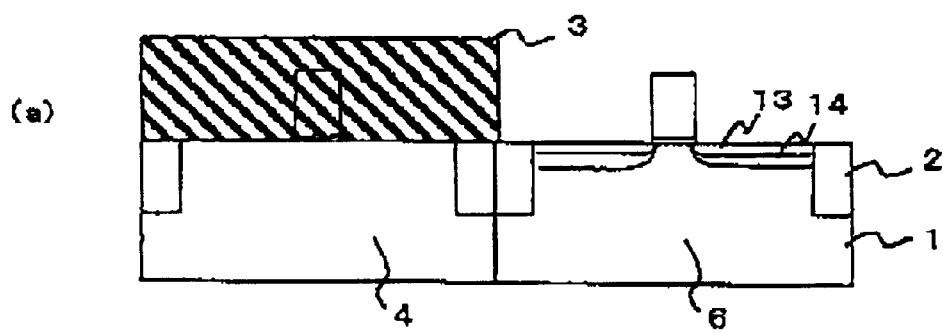
(b)
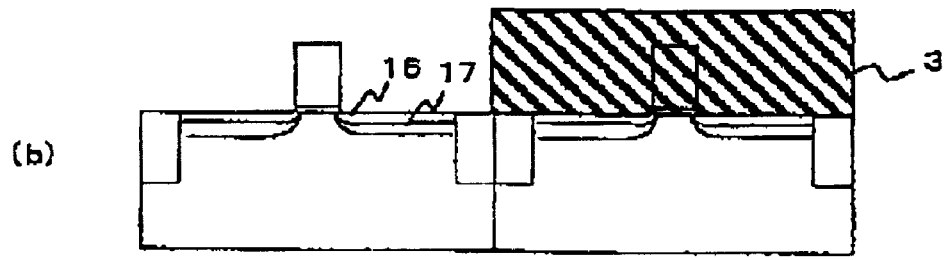

(FIG. 12)
(p-MOS formation region)  (n-MOS formation region)
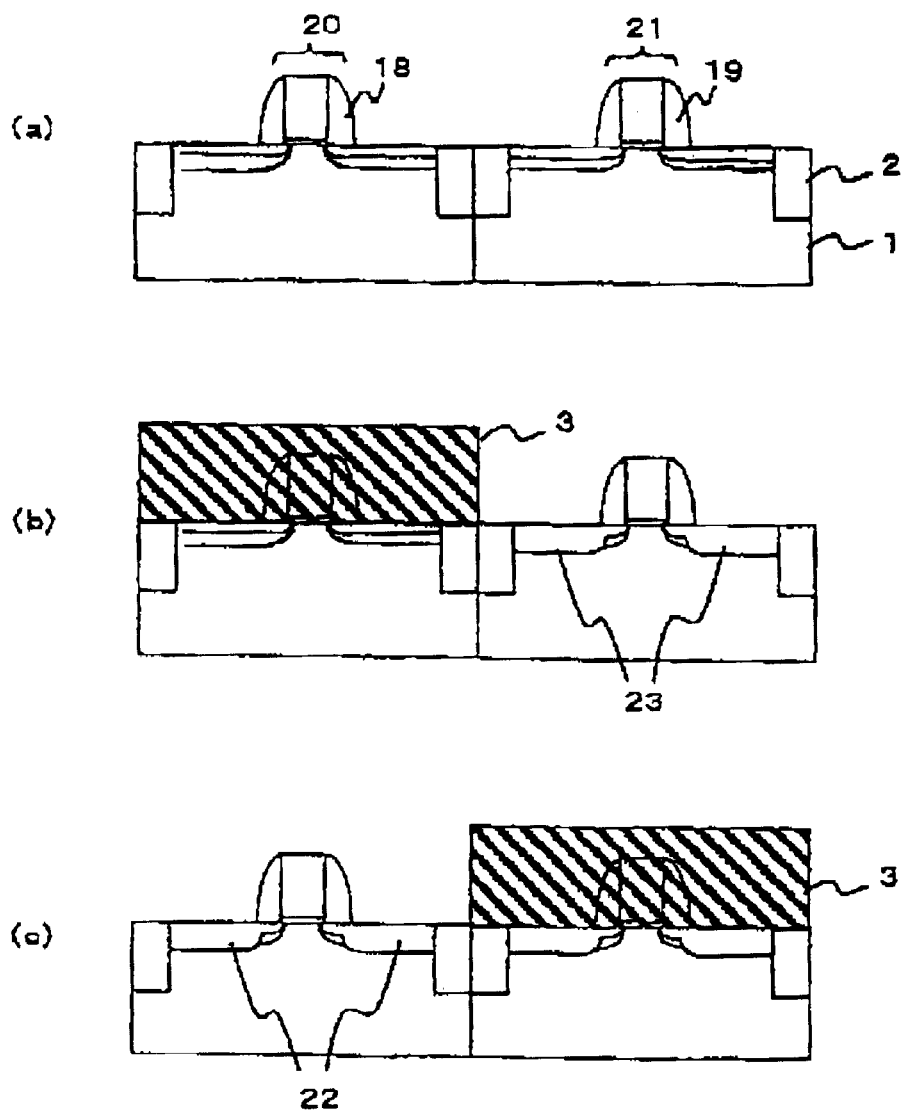

(FIG. 13)
(p-MOS formation region)     (n-MOS formation region)
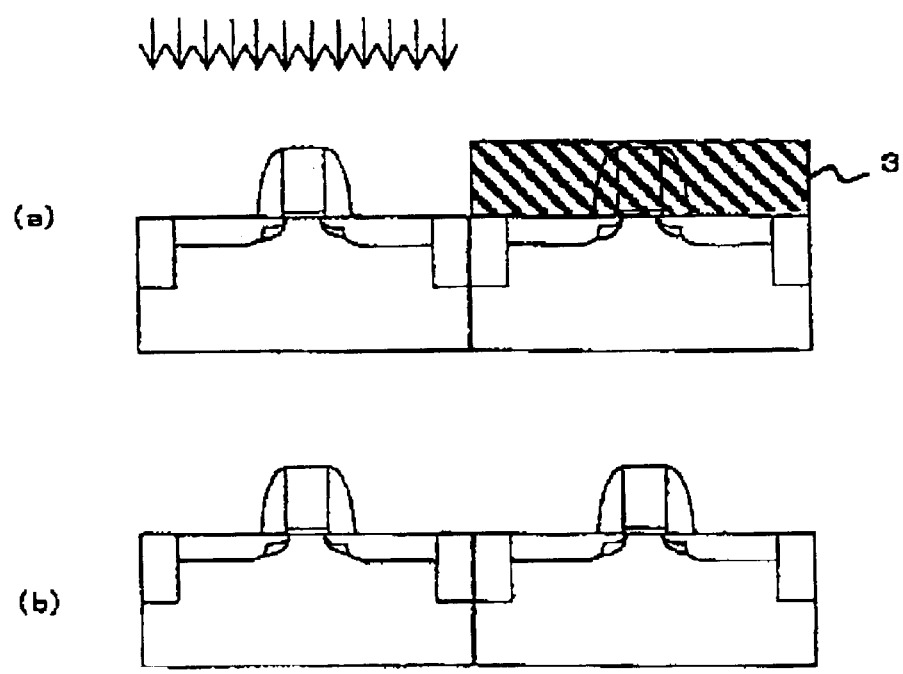

(FIG. 14)
(p-MOS formation region)    (n-MOS formation region)
(a) 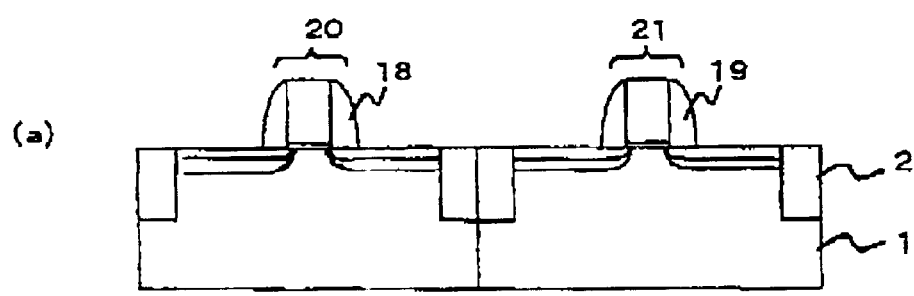
(b) 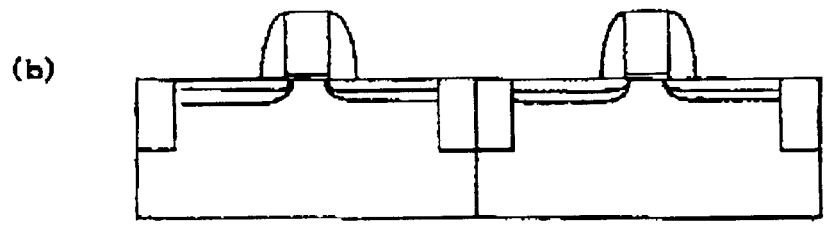
(c) 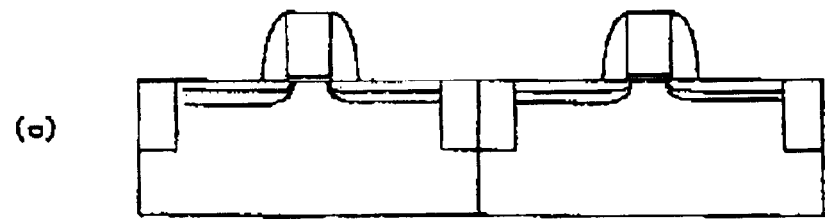

(FIG. 15)
(p-MOS formation region)   (n-MOS formation region)
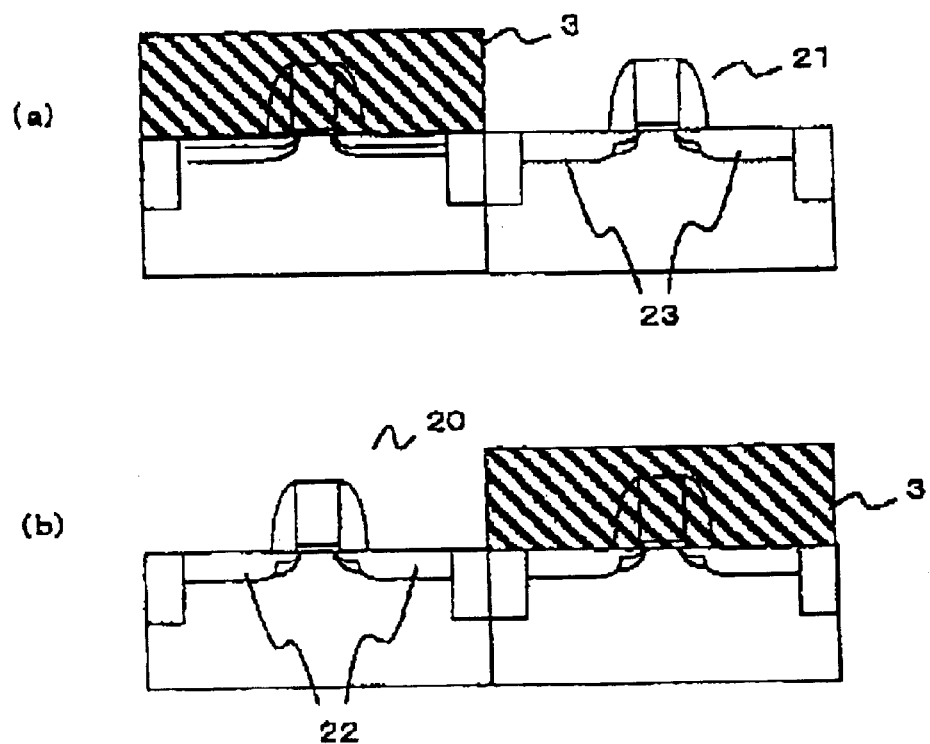

(FIG. 16)
(a) 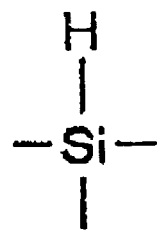  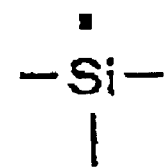
hydrogen-terminated structure      dangling bond
(b) 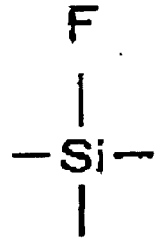
Fluorine-terminated structure (FIG. 17)
(p-MOS formation region)    (n-MOS formation region)
(a)
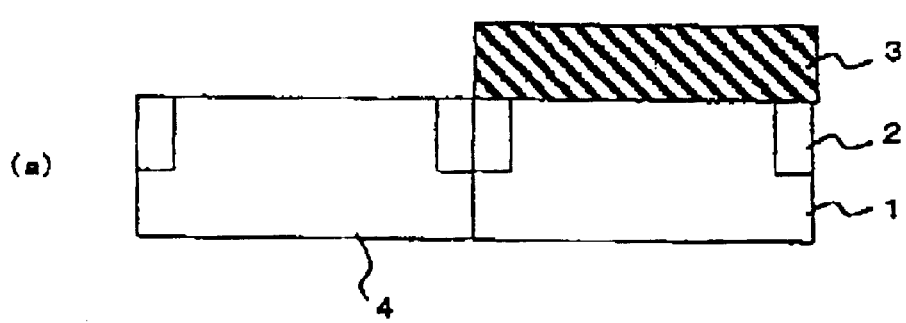
(b)
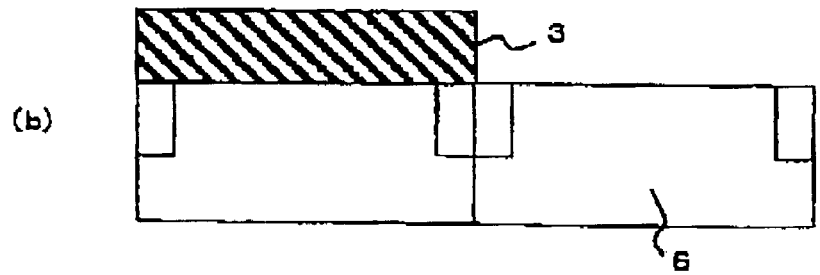
(c)
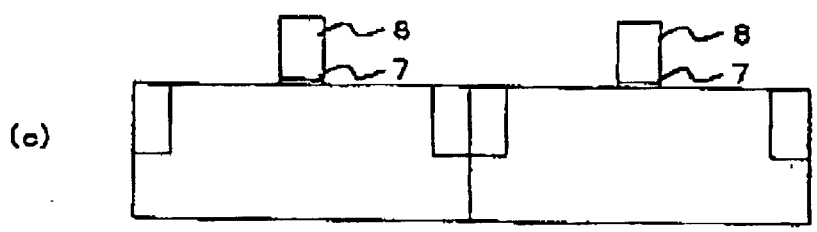

(FIG. 18)
(p-MOS formation region)    (n-MOS formation region)
(a)
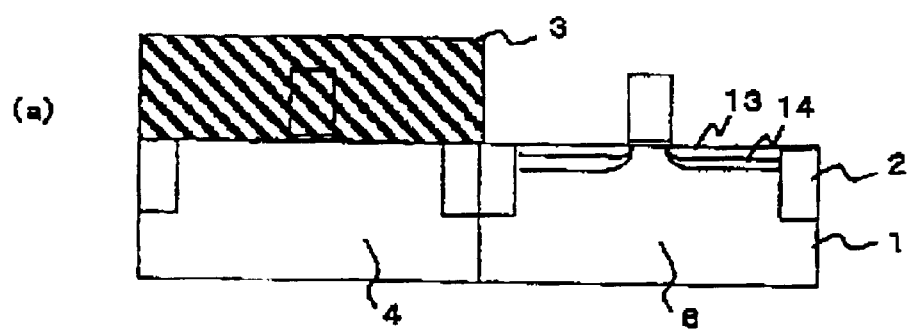
(b)
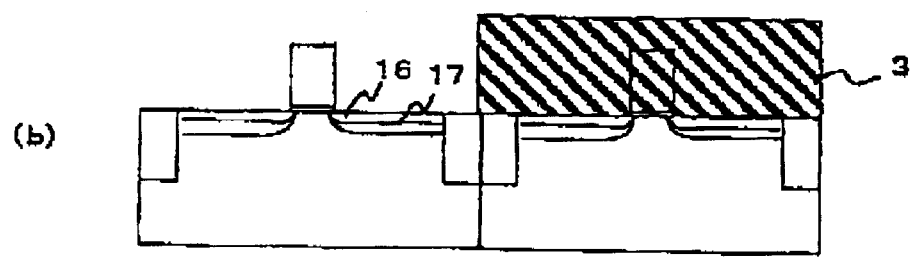

(FIG. 19)
(p-MOS formation region)    (n-MOS formation region)
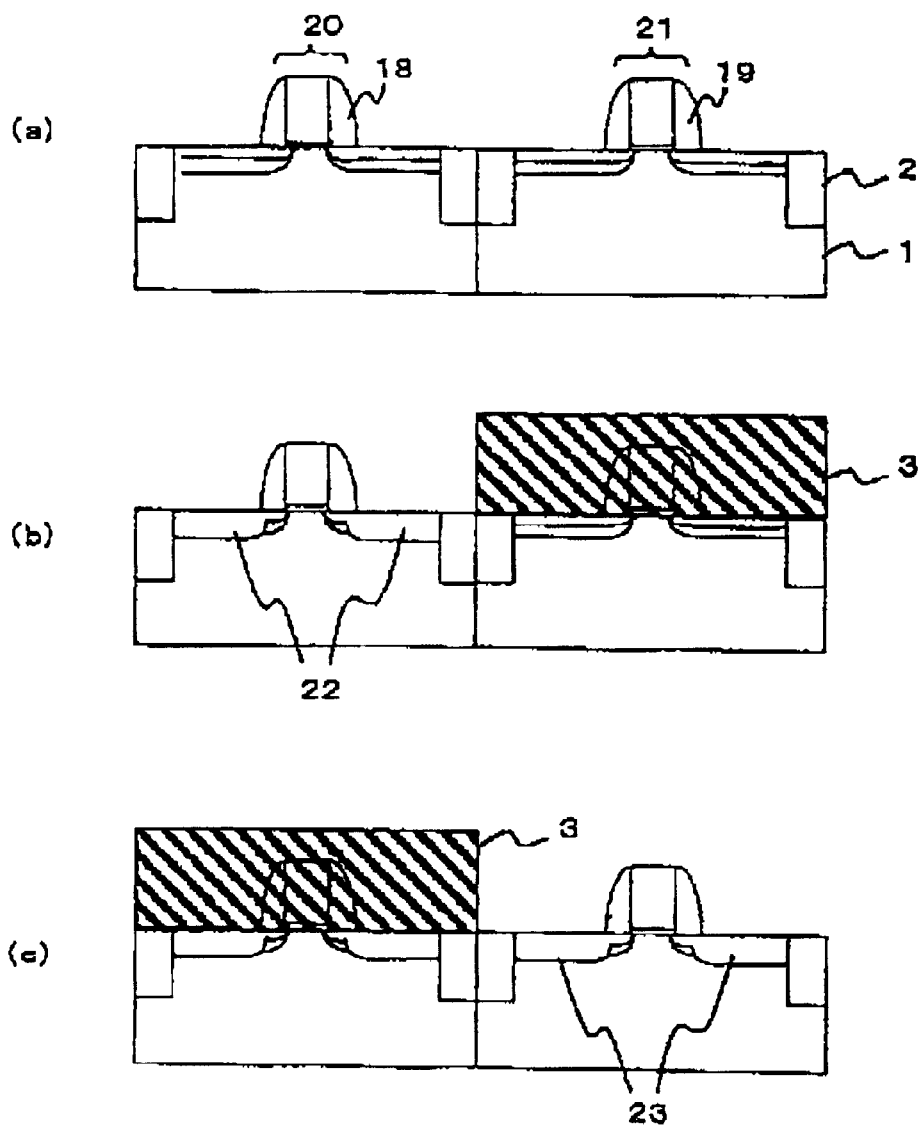

(FIG. 20)
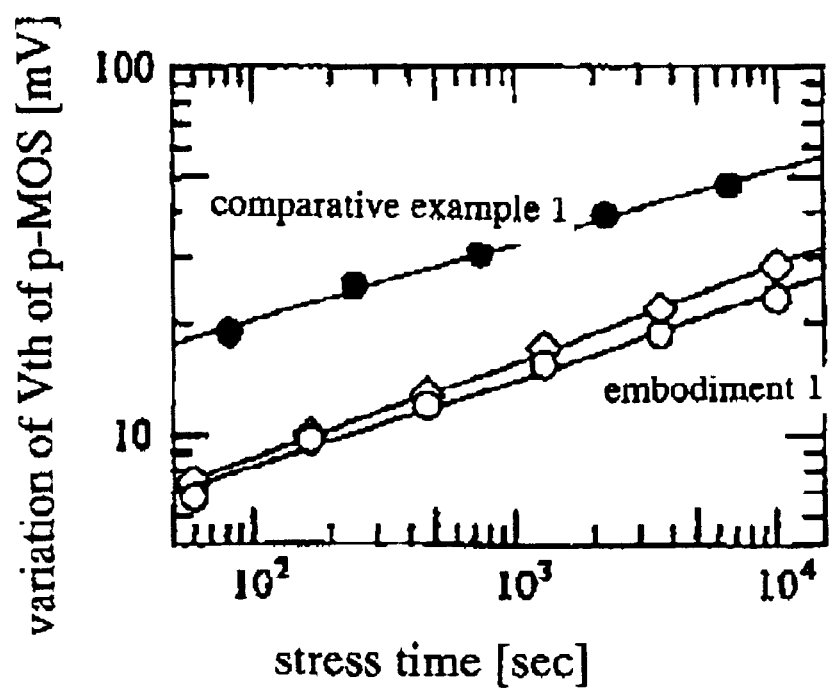

(FIG. 21)
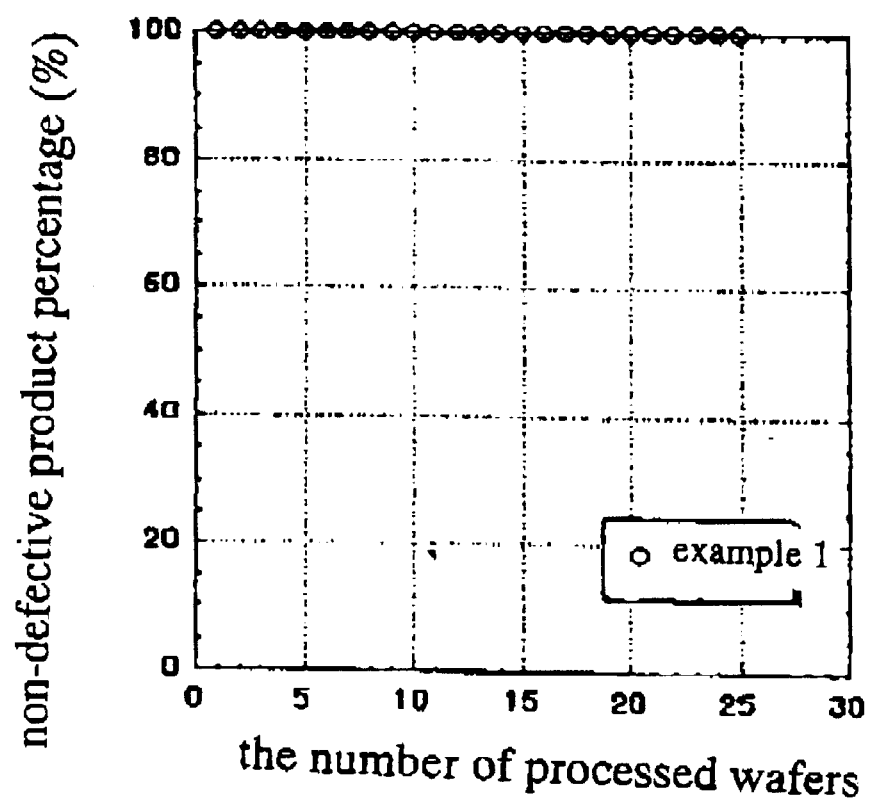

(FIG. 22)
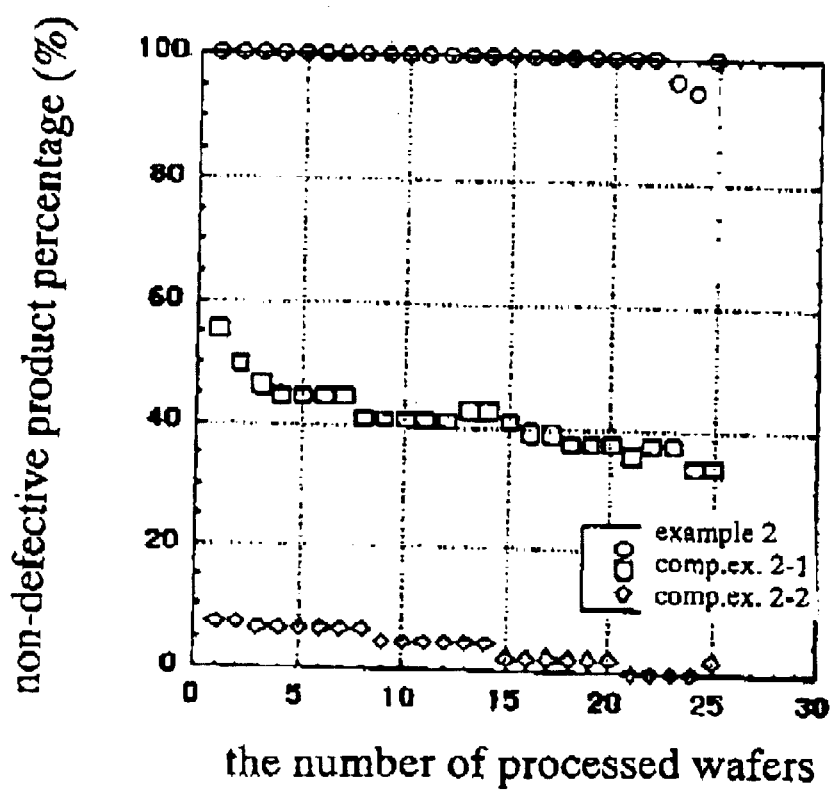

(FIG. 23)
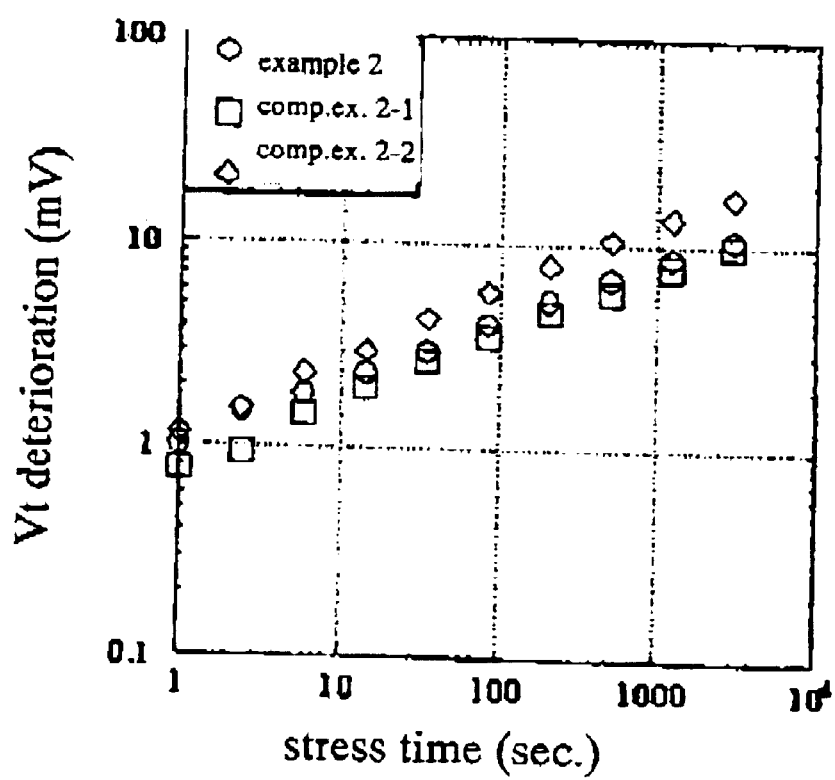

(FIG. 24)
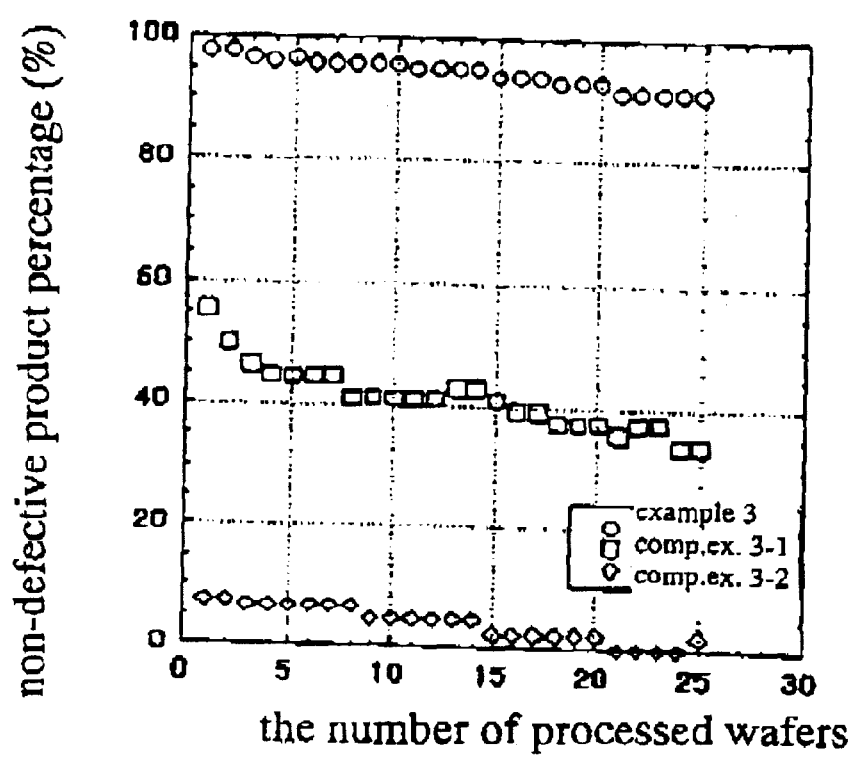

(FIG. 25)
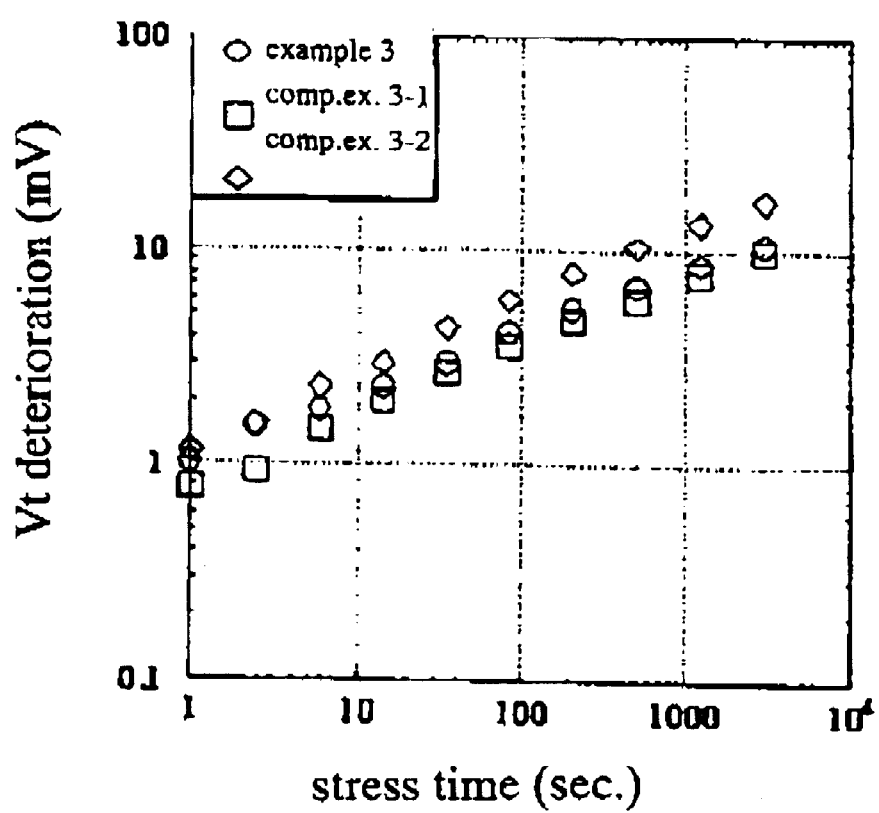

METHOD OF FORMING MOS TRANSISTOR

The present invention relates to a technique for improving a variation in threshold voltage of an MOS transistor through a long term use.

PRIOR ART

The conventional fabrication method for the MOS transistor will be explained with reference to FIGS. 17–19 by taking an example of CMOS (complementary MOS transistor) fabrication processes.

As shown in FIG. 17(a), after an isolation film 2 is formed on a silicon substrate 1, a photo-resist 3 is provided on an n-MOS formation region so that an n-type impurity such as phosphorus is ion-implanted into a p-MOS formation region, whereby an n-type well 4 is formed. Subsequently, the photo-resist 3 remains and an impurity is ion-implanted for adjustment to a threshold voltage. Subsequently, as shown in FIG. 17(b), a photo-resist 3 is provided on the p-MOS formation region for ion-implantation of a p-type impurity into the n-MOS formation region, whereby a p-type well 6 is formed. Subsequently, the photo-resist 3 remains and an impurity is ion-implanted for adjustment to a threshold voltage. Subsequently, a gate insulating film 7 is formed on a surface of an active region and a gate electrode material is then laminated thereon before patterning the same to form a gate electrode (FIG. 17(c)).

As shown in FIG. 18(a), a photo-resist 3 is provided on the p-MOS formation region for ion-implantation of an n-type impurity into the n-MOS formation region, whereby low impurity concentration source/don extension regions 13. Subsequently, the photo-resist 3 remains and a p-type impurity is ion-implanted to form a pocket region 14 for preventing a short channel effect. Similarly, as shown in FIG. 18(b), a p-type impurity and an n-type impurity are sequentially ion-implanted into the p-MOS formation region to form source/drain extension regions 16 and a pocket region 17.

Subsequently, side walls 18 and side walls 19 are respectively formed to a gate electrode 20 and a gate electrode 21 (FIG. 19(a)). Subsequently, a photo-resist 3 is provided on the n-MOS formation region before an ion-implantation of a p-type impurity is made into the p-MOS formation region, whereby a formation of the high impurity concentration source and drain regions 22 and an introduction of the impurity into the gate electrode 20 are concurrently made (FIG. 19(b)). A photo-resist 3 is provided on the p-MOS formation region for ion-implantation of an n-type impurity into the n-MOS formation region, whereby a formation of the high impurity concentration source and drain regions 23 and an introduction of the impurity into the gate electrode 21 are concurrently made (FIG. 19(c)). Thereafter, a heat treatment is made for activating the impurities in the source and drain regions and the gate electrode. As described above, the transistors forming the CMOS are formed.

The above processes are one example of the conventional fabrication method. Various methods such as methods of forming the source and drain regions have been on the investigation.

As the conventional CMOS has been used in a long term, then a phenomenon is caused that a threshold voltage Vth of the p-MOS varies. This phenomenon is more remarkable if the p-MOS has a surface channel structure and junctions of the source and drain region are shallow. This phenomenon is further remarkable if the scale down of the device is progressed and particularly if a gate length is not more than 0.2 micrometers and a threshold voltage of the transistor is low. In the past, the above phenomenon has rarely been considered. Notwithstanding, if the device is scaled down and a further high performance is required, then this is the important technical issue. The present inventor has made various investigations to the above phenomenon and could find out that the above phenomenon is cased by a slow trap of carrier in the channel region.

The region directly under the gate insulation film serves as the channel region of the transistor. Terminals of silicon forming this channel region is a dangling bond or bonded with hydrogen as shown in FIG. 16(a). The dangling bond traps carrier to reduce the function of the channel region. In the prior art, usually, a hydrogen anneal is carried out to terminate the same with hydrogen to form Si—H bonding for removing the dangling bond. The Si—H bonding energy is relatively low, for which reason it is likely to cause elimination of hydrogen over time and then the dangling bond is again formed. As the dangling bond is increased over time with use of the transistor, then a probability of trapping the carrier in the channel region is increased over time. This phenomenon will hereinafter referred to as a slow trap. This slow trap once appeared, a threshold voltage varies over time and a drain saturation current is lowered over time.

In Japanese patent application No. 11-070723, the present inventor proposed a solution method against the above problem with the slow trap. This proposal is that side walls are provided, and ion-implantation of an impurity for forming the source/drain regions and subsequent heat treatment for activation thereto, before the fluorine ions are ion-implanted and then the heat treatment is made in the furnace anneal to covert the dangling bonds and Si—H bonds present on an interface of a gate oxide film and silicon of substrate into Si—F bonds.

This method improves the slow trap characteristic and makes transistor's characteristics stable in the long term use. Particularly, in the range of the gate length (source-drain distance) from about 0.18 micrometers or more, the long term reliability can be ensured and the designed transistor's characteristics can be obtained. This technique is extremely effective. However, if the above method is applied to the scaled down transistors such that the gate length is 0.15 micrometers, it is possible that the threshold voltage of the transistor varies. This will be described hereinafter.

In accordance with the above method, the fluorine is introduced after the heat treatment for activation to the source and drain regions, for which reason normally the introduction is made from outside of the side walls. Namely, the fluorine is introduced from positions relatively distanced from the channel region directly under the gate electrode, for which reason the introduction of a relatively large amount of fluorine is necessary for forming sufficient Si—F bonds in the channel region. The introduction of the large amount of fluorine ions, however, causes many inter-lattice silicon atoms introduced into the substrate upon fluorine implantation. The inter-lattice silicon atoms make pairs with the impurity of the channel region to cause an accelerating diffusion in the silicon substrate, whereby variation in the impurity concentration profile of the channel region is caused.

The pairs of the inter-lattice silicon atoms and the impurity have a large diffusion coefficient, and shows a high speed diffusion even at a low temperature. For example, the diffusion is caused at a formation temperature (700–800° C.) of an oxide film by a CVD method. The phenomenon of re-profile of the impurity concentration due to the pairs of the inter-lattice silicon atoms and the impurity is caused by the fact that the inter-lattice silicon atoms are present at a concentration of not less than a thermal equilibrium concentration and in this state the heat treatment is carried out. Namely, the impurity is not diffused in the normal heat treatment. Notwithstanding, in case of the presence of many inter-lattice silicon atoms generated in the ion-implantation process, such a large diffusion phenomenon as treated at a temperature not less than a normal heat treatment temperature is caused.

The variation in the impurity concentration profile as caused is not so problem if the transistor size is relatively large. But as the transistor is scaled down and for example, the gate length is not more than 0.15 micrometers, then the variation is problem. This will be described hereinafter.

As the scale of the transistor is reduced, the power voltage for driving the transistor is also reduced. It is necessary to design a small threshold voltage as an important parameter of the transistor. As well know, the low threshold voltage can be realized by an impurity concentration of the channel region. If, however, the impurity concentration of the channel region is simply lowered, a punch-through phenomenon appears whereby it is possible that the transistor does not perform the normal operations. As the scale of the transistor is reduced, then the necessary accuracy in designing the impurity concentration of the channel edges is high. Particularly in case of the transistor of high performance having a gate length of not more than 0.15 micrometers, the threshold voltage is designed to be low. A slight difference in the impurity concentration profile of the channel region causes a large variation in the threshold voltage. The variation in the threshold voltage causes a large variation in the threshold voltages of the plural transistors included in a semiconductor device such as LSI. This provides a large influence to the circuit performances. Accordingly, if the problem with the slow trap can be solved, then a new harmful effect of reducing the stability in performance of the integrated circuit is caused.

It may be considered to change the timing of the introduction of fluorine as the method of introducing the fluorine with suppressing the variation in the impurity concentration profile of the channel region due to the enhanced diffusion. The enhanced diffusion is caused in the state after the heat treatment for activation to the source and drain regions namely in the state that the impurity is present in the inter-lattice sites. Only changing the timing of the fluorine introduction is difficult for preventing the enhanced diffusion. As another method of changing the timing of the fluorine introduction, it may be considered that the formation of the gate oxide film and the introduction of the fluorine are made before the channel impurity (threshold voltage control impurity) is then ion-implanted. This method, however, provides a damage to the gate oxide film in the ion-implantation. The performance and the yield of the transistor are largely reduced. Particularly, in the scaled down transistor, the thickness of the gate oxide film is thin and the damage by the ion-implantation is large, whereby the above problem is remarkable.

The various techniques for fluorine introduction have been investigated even the object is different from the above proposals.

In Japanese laid-open patent publication No. 5-251463, it is mentioned that for the purpose of preventing that an impurity ion-implantation for forming LDD regions ($n^-$-layer) generates crystal defects as the hot carrier traps on the interface between the gate oxide film and the silicon substrate in the LDD regions ($n^-$-layer), after $n^-$-layer impurity has been introduced, then an anneal is made in the fluorine gas for converting the crystal defects into the Si—F bonds to remove the hot carrier traps.

The Si—F bonds are formed before the activation to the $n^-$-layer, it is possible that phenomenon of the impurity concentration re-profile due to the impurity enhanced diffusion does not appear. The slow trap problem is not considered and no solution is proposed.

In Japanese laid-open patent publication No. 8-330441, it is disclosed that the thickness of the source and drain regions is realized with preventing boron punch-through. In accordance with the p-type MOS transistor, in order to reduce the thickness of the source and drain regions, the ion-implantation range is made shallow by use of the BF2 ions. BF2 is also ion-implanted into the polysilicon gate electrode for reducing the resistance. Fluorine in the gate electrode allows the boron to penetrate through the gate oxide film and reach the silicon substrate. As a result, the impurity profile of the channel region is changed to cause variation in Vth (boron punch-through problem). In order to prevent the problem with the boron punch-through and realize the reduction in thickness of the source and drain regions, after fluorine is ion-implanted for realizing the shallow ion-implantation range of the source and drain regions, boron is then implanted but fluorine is not ion-implanted into the gate electrode, namely, only boron is ion-implanted.

No consideration to the slow trap problem is made and nor issue is prevent for improving the slow trap life time and for solving the problem with the inter-lattice silicon atoms.

In Japanese laid-open patent publication No. 9-252117, it is disclosed that a transistor having fluorine-introduced terminated layers at a high concentration at the end portion of the LDD region in the gate electrode side or between the source and drain regions and the channel region. This transistor is capable of preventing variation in threshold voltage caused by the boron punch-through generation of the interface state on the Si/SiO2 interface upon boron introduction.

No consideration to the slow trap problem is made nor issue is prevent for improving the slow trap life time and for solving the problem with the inter-lattice silicon atoms. In accordance with this prior art, the fluorine containing terminated layers are formed between the channel region and the source and drain regions. On the channel region of the interface of between the gate insulating film and silicon of the substrate, large amounts of dangling bonds of silicon and Si—H bonds reside, for which reason the problem with the slow trap can not be solved.

In Japanese laid-open patent publication No. 7-321310, it is disclosed that in the n-type MOS transistor, after the gate insulating film is formed and then boron is implanted for controlling the threshold voltage and the punch-through stop in the step prior tot the formation of the gate electrode, before the fluorine is ion-implanted for pile-up of fluorine into the crystal defects caused by the boron implantation so as to form an impurity diffusion stopper layer in a region distanced from the substrate surface, whereby fluorine controls the diffusions of the impurities such as phosphorus and arsenic for forming the source and drain regions, and whereby the short channel effects are suppressed without lowering the current amplifying coefficient.

No consideration to the slow trap problem is made nor issue is prevent for improving the slow trap life time and for solving the problem with the inter-lattice silicon atoms. The fluorine is introduced into a deeper portion than the channel region. On the interface between the gate insulating film and silicon of the substrate, large amounts of dangling bonds of silicon and Si—H bonds reside, whereby the slow trap problem can not be solved.

In Japanese laid-open patent publication No. 7-283400, it is disclosed that since the formation of the LDD region by the ion-implantation makes it difficult to reduce the thickness of the layer and causes the problem with increase of the junction leakage current due to the crystal defect, the formation of the shallow LDD region is intended to be formed without ion-implantation. Boron-containing side wall oxide films are provided on side walls of the gate electrode, and the fluorine-introduced gate oxide films reside directly under the side walls. In this state, the heat treatment is carried out so that fluorine in the gate oxide films promotes the boron diffusion from the side wall oxide films into the semiconductor substrate.

Fluorine introduced in the gate oxide film causes the problem with the boron punch-through problem. No consideration to the slow trap problem is made nor issue is prevent for improving the slow trap life time and for solving the problem with the inter-lattice silicon atoms.

As described above, the fluorine-introduced layers are formed at ends of the source and drain regions or the fluorine is introduced into the gate insulating film for improvement in the structure of the field concentrating portions in the vicinity of the gate electrode and for improvement in the short channel characteristics and the leakage characteristics but never improving the slow trap characteristics.

In the above conventional techniques, no formation of the refractory metal silicide layer over the n-type gate electrode or the n-type diffusion layers is intended. In accordance with this technique, if the refractory metal silicide layer is formed over the above regions, then the shape of the silicide surface is deteriorated and the increase in the resistance of the silicide layer is caused.

(issue to be solved by the present invention)

In consideration of the above circumstances, the object of the present invention is to suppress the variation in threshold voltage due to deterioration of the short channel characteristics and to improve the slow trap characteristics of the MOS transistor for suppressing the variation in threshold voltage of the transistor in the long term use.

In consideration of the above circumstances, the object of the present invention is also to suppress the deterioration of the silicide surface shape and to reduce the resistance of the silicide layer and also improve the slow trap characteristics of the MOS transistor for suppressing the variation in threshold voltage of the transistor in the long term use.

(means for solving the issue)

The present invention for solving the above issues is defined by the following matters.

[1] A method of forming an MOS transistor, comprising the steps of:
  forming a gate electrode on a gate insulating film over a silicon substrate;
  carrying out an ion-implantation of fluorine ions into at least a silicon substrate surface around said gate electrode;
  carrying out a first heat treatment to remove inter-lattice silicon atoms generated in said ion-implantation; and
  after said first heat treatment, carrying out a second heat treatment to diffuse said fluorine ions into a region directly under said gate insulating film.

[2] The method of forming an MOS transistor as mentioned in [1], characterized in that a heat treatment temperature of the second heat treatment is lower than a heat treatment temperature of the first heat treatment.

[3] The method of forming an MOS transistor as mentioned in [1], characterized in that the first heat treatment is a lamp anneal, and the second heat treatment is a furnace anneal.

[4] The method of forming an MOS transistor as mentioned in [1], characterized in that a heat treatment temperature of the first heat treatment is 900–1100° C.

[5] The method of forming an MOS transistor as mentioned in any one of [1] to [4], characterized in that a heat treatment temperature of the second heat treatment is 600–850° C.

[6] The method of forming an MOS transistor as mentioned in [1], characterized in that said MOS transistor is a p-type transistor.

[7] The method of forming an MOS transistor as mentioned in [1], characterized by further comprising the steps of:
  after said second heat treatment, forming side walls on side faces of said gate electrode; and
  carrying out an ion-implantation of an impurity for forming source and drain regions.

[8] The method of forming an MOS transistor as mentioned in [1], characterized in that a dose of the fluorine ions is not less than $1 \times 10^{13}$ cm$^{-2}$ and not more than $1 \times 10^{15}$ cm$^{-2}$.

[9] The method of forming a complementary MOS transistor, said method including the steps of:
  forming an n-type MOS transistor and a p-type MOS transistor over a silicon substrate, wherein said p-type MOS transistor is formed by a method of [1], said method characterized by the steps of:
    coating a part or an entire of an n-type MOS transistor formation region by a mask for subsequent ion-implantation of said fluorine ions; and
    forming refractory metal silicide layers both on at least a part of a surface of a gate electrode and diffusion layers forming the p-type MOS transistor and on at least a part of a surface of a gate electrode and diffusion layers forming the n-type MOS transistor.

[10] The method of forming a complementary MOS transistor, said method including the steps of:
  forming an n-type MOS transistor and a p-type MOS transistor over a silicon substrate, wherein said p-type MOS transistor is formed by a method of [1] and
  carrying out an ion-implantation of arsenic for forming diffusion layers and/or a gate electrode of said n-type MOS transistor, said method characterized in that:
    a dose of said ion-implantation of arsenic is not more than $4 \times 10^{15}$ cm$^{-2}$, before refractory metal silicide layers are formed both on at least a part of a surface of a gate electrode and diffusion layers forming the p-type MOS transistor and on at least a part of a surface of a gate electrode and diffusion layers forming the n-type MOS transistor.

[11] A method of forming a complementary MOS transistor, said method including the steps of:
  forming an n-type MOS transistor and a p-type MOS transistor over a silicon substrate, wherein said p-type MOS transistor is formed by a method of [1] and
  carrying out an ion-implantation of arsenic for forming diffusion layers and/or a gate electrode of said n-type MOS transistor, said method characterized in that:
    an acceleration voltage for said ion-implantation of arsenic is not more than 30 KeV, before refractory metal silicide layers are formed both on at least a part of a surface of a gate electrode and diffusion layers forming the p-type MOS transistor and on at least a part of a surface of a gate electrode and diffusion layers forming the n-type MOS transistor.

[12] The method of forming a complementary MOS transistor as mentioned in any one of [9]–[11], characterized in that a refractory metal for a component of said refractory metal silicide film is cobalt, nickel or iron.

In order to improve the slow trap life time as the long term reliability characteristic of the transistor, it is effective to introduce fluorine into the entire region of the channel region. If fluorine is introduced into the substrate by the ion-implantation, then the inter-lattice silicon atoms are also introduced, whereby variation in the impurity concentration profile of the channel region due to the enhanced diffusion is caused. In this case, the remarkable reductions in the performance and the yield of the transistor are caused.

The present invention is to solve this problems. Even in the state of the presence of the channel impurity (threshold voltage control impurity), the fluorine introduction is made with the effective suppression to the enhanced diffusion of fluorine to form Si—F bonds in the channel region at high efficiency. Namely, after the inter-lattice silicon atoms generated in the fluorine ion-implantation is disappeared by the first heat treatment before the second heat treatment is carried out to move fluorine into the channel region, thereby forming the Si—F bonds at high efficiency.

The method of forming the MOS transistor of the present invention is characterized in that after the introduction of the fluorine ions, then the heat treatments are carried out by the two steps.

The first heat treatment is to remove the inter-lattice silicon atoms generated in the surface of the substrate due to the fluorine ion implantation. Bonding pairs of the inter-lattice silicon atoms and the impurity become large in diffusion coefficient, whereby the pairs are diffused at high speed in the silicon substrate at a low temperature (enhanced diffusion). As a result, the impurity profile of the channel region is changed and the short channel characteristic (stability to the short channel effect) is deteriorated to increase the variation in threshold voltage. The present invention solve such the problem by removing the inter-lattice silicon atoms.

The second heat treatment of the present invention causes the diffusion of fluorine into the channel region under the gate electrode. This heat treatment drives the fluorine introduced into the surfaces of the source and drain formation regions into the region under the gate electrode. Silicon forming the channel region is terminated with hydrogen or has dangling bonds as shown in FIG. 16(*a*). Those are substituted with fluorine as shown in FIG. 16(*b*). The second heat treatment causes the distribution of fluorine over the entire region of the channel region. The Si—H bonds and the dangling bonds of silicon forming the channel region are substituted with fluorine at high efficiency, whereby the slow trap characteristics are remarkably improved. This heat treatment causes fluorine to surely be bonded. The sufficient improvement in the slow rap characteristics can be obtained. It is possible to suppress the deterioration of the device performance caused by the residual fluorine not bonded thereto in the later process.

The present invention increases the bonding efficiency of fluorine to realize the minimized fluorine introduction. This is advantageous in the process. The bonding efficiency is a ratio of fluorine consumed for the Si—F bonds to fluorine as introduced. If the bonding influence of fluorine is high, then the minimum fluorine introducing amount enables the conversions of the dangling bonds and the S—H bonds into the Si—F bonds efficiently.

In order to improve the slow trap characteristics, it is necessary that the fluorine substitute of not less than a predetermined degree is made throughout the entire region of the channel region. If the fluorine bonding efficiency is low, then it is necessary to introduce a large mount of fluorine for obtaining the slow trap characteristics. In this case, however, as the non-bonded is introduced into thee silicon substrate. If thereafter the upper level insulating film such as the inter-layer insulator is formed in the post-process, then the fluorine gas is confined in the upper level film or the interface thereof, and it is possible that the film expansion or peeling appears. The present invention conducts the heat treatments in the two steps for solving the problems. The amount of the fluorine introduction is minimized, thereby to reduce fluorine which penetrates the gate electrode and is deposited on the gate insulating film. The fluorine deposition on the gate insulating film causes a remarkable boron punch-through. Particularly in the scaled down device, for example, the transistor having the gate electrode of a gate length of not more than 0.15 micrometers, the variation in threshold voltage is problem. The present invention solves the specific problem to the scaled down device.

In accordance with the method of forming the MOS transistor, after the fluorine is introduced, the specific heat treatments are carried out for diffusion fluorine into the region directly under the gate insulating film, thereby improving the slow trap characteristics. This point is different from various techniques for the fluorine introduction described in the prior art. Those prior arts are to introduce fluorine into the edge portions of the source and drains and the gate insulating film. Those are different from the present invention in the deposition of fluorine. In order to improve the slow trap characteristics, it is effective to realize the deposition throughout the entire region of the channel region directly under the gate insulating film. The present invention realizes these state by the two-steps heat treatments for improvement in the slow trap characteristics.

In accordance with the present invention, fluorine ions are ion-implanted into the silicon substrate surface around the gate electrode. It is possible that at this time, fluorine ions are implanted into the gate electrode. In accordance with the present invention, after the gate electrode is formed, then the fluorine ions are implanted, for which reason even if fluorine is ion-implanted into the entire surface of the silicon, then the gate electrode serves as a mask, and almost no fluorine is introduced into the gate insulating film in the channel region. Even the fluorine ions are implanted into the gate electrode, the problem with the boron punch-through is unlikely to be caused even the fluorine ions into the gate electrode.

In accordance with the inventions mentioned in [8] to [12], revelatory metal silicide layers are formed on surfaces of the gate electrode ad the diffusion layers of the MOS transistor for reduction in the resistances. In accordance with the inventions, the deterioration in quality of the silicide layer due to the fluorine introduction is effectively prevented.

In order to improve the slow trap life time as the long term reliability characteristic of the transistor, it is effective to introduce fluorine into the entire region of the channel region. However, if the silicidation is made to the fluorine implanted portions over the n-type gate electrode ad the n-type diffusion layers, then the silicidation reaction is remarkably controlled in the presence of many crystal defects in the Si crystal adjacent to the surface due to the ion-implantation.

In order to prevent the conduction between the gate electrode and the diffusion layer electrodes, unreacted metals over the side wall spacers are removed for removing the unreacted silicides over the n-type gate electrode and the n-type diffusion layer electrodes, silicon or silicon dioxide not eluting into the etchant reside, resulting in the elevated surface shape and the highly resistive silicide layer.

If fluorine is introduced by the fluorine implantation after many Si—Si bonds are cut by the ion-implantation of an n-type impurity of large atomic weight, then Si—F bonds having an extremely large bonding energy are formed. Also many Si—Si bonds are cut by the ion-implantation of an n-type impurity of large atomic weight into the previous fluorine-implanted region, whereby Si—F bonds between inter-lattice-existent fluorine and silicon and having an extremely large bonding energy are formed. In the silicidation reaction with Si as the diffusion species, the silicidation reaction for substituting the bonding species of Si are remarkably suppressed.

The inventions mentioned in the above [8] to [12] are to solve such the problem, and to effectively prevent the deterioration in shape of the silicide surface and the increase in the resistance and also to form Si—F bonds in the channel region efficiently.

The above descriptions address to prevent the deterioration in shape of the silicide surface over the n-type gate electrode and the n-type diffusion layer electrodes as formed by the implantation of arsenic ions and also prevent the increase in the resistance. It is of course effective to prevent the deterioration in shape of the silicide surface over the n-type gate electrode and the n-type diffusion layer electrodes as formed by the implantation of other heavy metals (for example antimony).

(practicable modes of the invention)

As to the order of the first and second heat treatments, it is important for the present invention that the first heat treatment is carried out before the second heat treatment is carried out. If the second heat treatment is previously carried out, then the heat treatment for fluorine diffusion is carried out in the presence of the inter-lattice silicon atoms on the substrate surface, whereby other impurities are also diffused, and the impurity profile is made different from the desired profile. For example, the impurity for the threshold voltage control or the impurity in the source and drain regions may vary the profile upon the fluorine diffusion. If the first and second heat treatments are concurrently carried out, the above problem is also raised.

In accordance with the present invention, the first heat treatment is to extinct the inter-lattice silicon atoms. It is preferable that this heat treatment is carried out in a short time period. If the first heat treatment time period is so long, the concentration profile of the impurity already introduced into the substrate may vary due to the presence of the inter-lattice silicon atoms introduced into the substrate in the fluorine ion-implantation. For example, the concentration profiles of the impurity for the control to the threshold voltage of the transistor and the impurity of the source and drain regions may vary. Particularly, boron or arsenic form pairs with the inter-lattice silicon atoms for high speed diffusion in the silicon substrate. If after those impurities have been introduced, the first heat treatment is then carried out, it is preferable that the heat treatment is carried out in the short time period for preventing the diffusion of those impurities. If in order for causing sufficient disappearance of the crystal defects in the short time heat treatment, the increase in temperature of the heat treatment is needed. Therefor, it is preferable that the first heat treatment comprises lamp anneal such as rapid thermal anneal. Conditions for the heat treatment are optically adjusted by the existence of the through oxide film in the fluorine ion-implantation. The heat treatment temperature is preferably 900–1100° C. The heat treatment time is preferably about 5 seconds to 2 minutes. The heat treatment time is the time period in which the temperature is held at the predetermined temperature after reached thereat. Under the above conditions, it is possible to efficiently remove the inter-lattice silicon atoms with suppression to the impurity diffusion together with fluorine.

The second heat treatment is to diffuse fluorine into the channel region under the gate electrode. This heat treatment causes the fluorine is diffused into the entire of the channel region directly under the gate insulating film, so that the diffused fluorine is bonded to silicon. The second heat treatment condition is lower in temperature than the first heat treatment and longer in time than the first heat treatment. If the second heat treatment condition is higher in temperature and longer in time than the first heat treatment, then it is possible that the variation in profile of the other impurity resent in the substrate. The temperature of the second heat treatment is preferably not less than 600° C., and more preferably not less than 650° C., and also preferably not more than 850° C., and more preferably not more than 800° C. If the temperature is too low, then the substitution of fluorine is insufficient, and the effect of the improvement to the slow trap characteristic is insufficient. If the temperature is too high, then the diffusions of the impurity for controlling the threshold voltage and the impurity in the source and drain regions are also diffused together with the fluorine diffusion, whereby the profile of those impurities are varied. This tendency is remarkable if the impurity is boron. The second heat treatment is preferably funnel anneal. The heat treatment time is preferably 5–120 minutes and more preferably 10–60 minutes. Dangling bonds of silicon in the region directly under the gate insulating film are substituted with fluorine.

In accordance with the present invention, the ion-implantation of fluorine is to ion-implant fluorine and is different from an implantation of a compound such as boron fluoride ($BF_2^+$).

In accordance with the present invention, the first heat treatment is preferably carried out following to the fluorine ion-implantation but before may other heat treatments. Enhanced diffusions of pairs of the inter-lattice silicon atoms and impurity are caused in the heat treatment immediately after the inter-lattice silicon atoms are generated. If immediately after the fluorine ion implantation, the process for forming the oxide film by the CVD for forming side walls, a heat treatment of about 700–800° C. is carried out, wherein the enhanced diffusion is caused. If immediately after the fluorine ions ion-implantation, the heat treatment is carried out for activating the source/drain regions, or the heat treatment to form the inter-layer insulator or other heat treatment are carried out, then same is caused. In order to prevent the undesirable enhanced diffusion, it is preferable that the first heat treatment is carried out prior to the other heat treatments.

If the present invention is applied to p-MOS (p-type transistor), particularly applied to the surface channel p-MOS with the p-type electrode, then the problem with the slow trap is more effectively solved. In case of p-MOS, the drain saturation current is smaller than the n-MOS, and the influence of the slow trap is likely to be large. Particularly, in case of the surface channel p-MOS with the p-type electrode, the channel region is narrow, for which reason the influence of the slow trap is larger. In accordance with the present invention, if boron is used as the impurity, and if the invention is applied to the process for forming shallow source and drain regions by an ion-implantation of not more than 8 keV at an acceleration energy, then the problem with the slow trap is more effectively solved.

In accordance with the present invention, if the fluorine ion-implantation is carried out prior to the formation of the cobalt silicide, then a photo-resist is provided on the n-MOS formation region, so that the fluorine ion is implanted only into the p-MOS formation region. If the fluorine ion is implanted also into the n-MOS formation region, then deterioration in shape of the silicide surface and the high resistance thereof over the n-type gate electrode and the n-type diffusion layer electrodes is caused. Particularly, large atomic weight ions such as arsenic ions or antimony ions are implanted at a high energy or at a high dose, then many Si—Si bonds adjacent to the surface of the silicon substrate are broken, and in place the Si—F bonds are formed which have a larger bonding energy. The silicidation reaction is that the coordinators bonded with the silicon atoms of the substrate are eliminated and substituted by the silicon or cobalt in the self-scavenging phenomenon. The above elimination reaction is unlikely to be caused, whereby the silicidation reaction is suppressed. As a result, the formed cobalt silicide film is inferior in etching resistivity and is likely to be eluted into an etching solution in the process for removing the unreacted metal over the side wall spacers for preventing the conduction between the gate electrode ahd the diffusion layer electrodes.

If the fluorine ion is implanted into the n-MOS formation region, the dose of the arsenic ions is not more than $4 \times 10^{15}$ $cm^{-2}$, and more preferably not more than $1 \times 10^{15}$ $cm^{-2}$, or at an acceleration energy of not more than 30 keV of arsenic ions, so that the n-type gate electrode and the n-type diffusion layer electrodes are formed. In this case, it is possible, in addition to the arsenic ions, the relatively small atomic weight ions such as phosphorus ions are sued for forming the n-type gate electrode and the n-type diffusion layer electrodes. If the dose of arsenic ions and the acceleration voltage are decreased, or the atomic weight of the ions to be implanted is made small, it is possible to reduce the Si—F bonds in the vicinity of the silicon substrate surface.

The present invention is particularly effective if applied to the MOS transistor having a gate electrode width of not more than 0.15 micrometers or the MOS transistor having a gate insulating film thickness of not more than 3 nanometers, because in such the scaled down FET, the variation of the threshold voltage due to the slow trap and the hot electron effects is large.

Preferred embodiments of the present invention will be described with reference to the drawings. In each of the following embodiments, the temperature of the heat treatment means the substrate temperature, and the heat treatment time is a time for holding the substrate temperature after the temperature reached a predetermined temperature.

(First Embodiment)

The description is made with reference to FIGS. 1–4, wherein the present invention is applied to the CMOS manufacturing processes. As shown in FIG. 1(a), field oxide films 2 are formed on a silicon substrate 1 before a photo-resist 3 is provided on an n-MOS formation region, so that an n-type impurity such as phosphorus is ion-implanted into a p-MOS formation region, thereby forming an n-well 4. The photo-resist 3 remains, and the impurity is further implanted for adjusting the threshold voltage.

Subsequently, as shown in FIG. 1(b), a photo-resist 3 is provided on the p-MOS formation region for ion-implantation of the p-type impurity into the n-MOS formation region, whereby a p-well region 6 is formed. The photo-resist 3 remains, and the impurity is further implanted for adjusting the threshold voltage.

After a gate insulating film 7 is formed on a surface of the active region, then a gate electrode material is laminated. As the gate insulating film, the silicon oxide film or the silicon nitride film is available. In this embodiment, the polycrystalline silicon 8 is formed as the gate electrode material. It is not necessary to limit the material into this. A tungsten-containing film or laminations of the tungsten-containing film and the polycrystalline silicon film may be available. The thickness of the polycrystalline silicon 8 is, for example, 150 nanometers.

After the gate insulating film 7 and the gate electrode material are formed, then those are patterned by a known etching process to form a gate electrode as shown in FIG. 1(C). The gate length is optionally set. The present invention is particularly remarkable if applied to the manufacturing method for the MOS transistor containing the gate electrode having a gate length of not more than 0.18 micrometers and particularly not more than 0.15 micrometers. The transistor provided with the gate electrode having such the gate length receives the strict requirement for the short channel characteristics and also the absolute value of the threshold voltage is dropped, whereby the problem with the slow trap is remarkable.

As shown in FIG. 2(a), the photo-resist 3 is provided on the p-MOS formation region. The n-type impurity is ion-implanted into the n-MOS formation region to form source and drain extension regions 13. Subsequently, the photo-resist 3 remains, and the p-type impurity is ion-implanted to form pocket regions 14. Then, the heat treatment of RTA is then carried out for removing the inter-lattice silicon atoms.

After the photo-resist 3 is peeled, than a photo-resist 3 is provided on the n-MOS formation region to carry out an ion-implantation of fluorine as shown in FIG. 2(b), whereby a fluorine-implanted region 10 is formed over the substrate. In this embodiment, the ion-implantation is carried out only to the p-MOS. It is also possible to carry out the ion-implantation concurrently to the n-MOS. The dose of the ion-implantation is not less than $1 \times 10^{13}$ $cm^{-2}$, and more preferably not less than $5 \times 10^{13}$ $cm^{-2}$, and not more than $1 \times 10^{15}$ $cm^{-2}$, and more preferably not more than $5 \times 10^{14}$ $cm^{-2}$. If the amount of the fluorine implantation is too high, then the deterioration in the short channel effect is remarkable. If the amount of the fluorine implantation is too low, then Si—H bonds or dangling bonds of silicon are insufficiently substituted by fluorine, and the improvement in the slow trap characteristics is insufficient. It is preferable that an acceleration voltage is not less than 10 keV and not more than 30 keV. If the acceleration voltage is too high, then the mount of the inter-lattice silicon atoms is large, thereby making it difficult to cause the same disappear in the post heat treatment and the re-profile of the impurity by the enhanced diffusion may be caused. If the acceleration voltage is too low, the introduction of fluorine is insufficient and the improvement in the slow trap characteristics is insufficient. It is also possible to provide an insulating film, for example, a through oxide film over the substrate surface for the fluorine ion-implantation.

After the fluorine ion-implantation, the first and second heat treatments are then carried out as shown in FIG. 2(C).

The first heat treatment is to extinct the inter-lattice silicon atoms generated in the substrate surface upon the fluorine ion-implantation. Preferably, this heat treatment is carried out at a high temperature and in a short time for suppressing the damage to the substrate and sufficiently activating the impurity. The RTA is preferably available. In this case, the conditions for the first heat treatment are that the heat treatment temperature is 900–1100° C., and the heat treatment time is about 5 seconds to 2 minutes.

The second heat treatment is to diffuse fluorine into the channel region under the gate electrode. The fluorine introduced into the surfaces of the source and drain formation regions adjacent to the gate electrode is driven into the region under the gate electrode. This heat treatment substitutes the Si—H bonds, and the dangling bonds of silicon of the channel region with fluorine efficiently. This heat treatment is preferably the funnel anneal. The heat treatment temperature is preferably not less than 600° C., and more particularly 650° C., and preferably not more than 850° C., and more particularly 800° C. If the temperature is too low, the fluorine substitute is insufficient, and the improvement in the slow trap characteristic is insufficient. If the temperature is too high, then the impurity for adjustment to the threshold voltage is diffused together with the fluorine diffusion, then the threshold voltage of the transistor may be varied.

As shown in FIG. 2(d), the photo-resist 3 is provided on the n-MOS formation region, so that the p-type impurity is ion-implanted into the p-MOS formation region to form source/drain extension regions 16. Subsequently, the photo-resist 3 remains and the n-type impurity is ion-implanted to form a pocket region 17.

Subsequently, side walls 18 and 19 are provided to the gate electrodes 20 and 21 respectively as shown in FIG. 3(a). After the photo-resist 3 is provided on the n-MOS formation region, the p-type impurity is ion-implanted into the p-MOS formation region, whereby impurity introductions into the source and drain regions 22 and the gate electrode 20 are concurrently carried out as shown in FIG. (b). As the p-type impurity, boron ($B^+$) or boron fluoride ($BF_2^+$) is available. In case of boron, the following advantages are obtained.

The formation of the source and drain regions by boron fluoride ion-implantation is advantageous to realize the shallow junction. In this case, however, the problem is likely to be caused with the boron punch-through, wherein boron is captured into the gate insulating film and boron penetrates the gate insulating film and is diffused into the silicon substrate. Fluorine is introduced at double amount of a large amount of boron introduced for reducing a resistance of the gate electrode, whereby fluorine penetrates the gate oxide film and a boron diffusion is promoted. The use of boron implantation can prevent boron penetration but causes reduction in slow trap characteristics as compared to the boron fluoride implantation. This was verified by the present inventor's investigation. It is important how to control the fluorine introduction. The use of the method of forming the MOS transistor in accordance with the present invention prevents the boron penetration and also improves the slow trap characteristics. This allows the formation of such the high performance transistor as not present in the prior art. In accordance with the present invention, the fluorine is introduced at an optimum amount to improve the slow trap characteristics without rising the boron penetration problem.

Subsequent to the above processes, a photo-resist 3 is provided on a p-MOS formation region for ion-implantation of n-type impurity to form source and drain regions 23 and to introduce the impurity into the gate electrode 21 concurrently (FIG. 3(c)).

Thereafter, a heat treatment is carried out for activation to the impurities in the source and drain regions and the gate electrode. This heat treatment is preferably carried out at a high temperature but in a short time for suppressing damage to the substrate and also for obtaining a sufficient activation to the impurity. The RAT is preferably available. In this case, heat treatment conditions are optionally selected. For example, the lamp anneal such as RTA may be carried out at a temperature of 900–1000° C. for about 5 seconds to about 1 minute.

In accordance with this embodiment, subsequent to the above process, a cobalt silicide 27 to reduce the resistances of the source and drain regions an the contract resistance (FIG. 4(a)). The cobalt silicide 27 may be formed by the steps of depositing a cobalt film of about 10 nm in thickness entirely over the substrate and then carrying out a heat treatment.

After an inter-layer insulator is formed entirely, a tungsten plug 29 is then formed (FIG. 4(b)). In this embodiment, the inter-layer insulator is a BPSG film 28. Other insulator films such as SOG(spin On Glass) film and HSQ (hydrogen silisesuioxane) film are, however, available. After the inter-layer insulator is deposited, then contact holes are provided. A barrier metal film and a plug metal material are formed to fill the contact holes. The plug metal material is, for example, tungsten film. The barrier metal film is optionally selected in accordance with the plug metal material. Ti/TiN is preferable to the tungsten film. Thereafter, upper level interconnections are formed in the known technique to complete the CMOS.

In this embodiment, the description was made by taking the CMOS fabrication processes. This is also applicable to formations of other devices such as DRAM.

(Second Practicable Mode)

This embodiment is similar to the first embodiment but different in time of carrying out the fluorine implantation process and positions to which the fluorine is implanted. The description will be made with reference to the drawings.

Similarly to the first embodiment, the processes shown in FIG. 1 are carried out. Next, as shown in FIG. 5(a), a photo-resist 3 is formed in the p-MOS formation region. An ion-implantation of n-type impurity into the n-MOS formation region is made to form source-drain extension regions 13. The photo-resist 3 remains, and an ion-implantation of p-type impurity is carried out to form pocket regions 14. For forming the source-drain extension regions 13, it is preferable that the dose of the n-type impurity and the acceleration voltage are below predetermined values. In case of arsenic, it is preferable that the dose is not more than $4 \times 10^{15}$ $cm^{-2}$ or the acceleration voltage not more than 30 keV, so that when the cobalt silicide 27 is formed over the diffusion layers and the gate electrodes in the later process, it is possible to prevent the deterioration of in shape of the cobalt silicide surface and suppress the increase in resistance.

After the photo-resist 3 is peeled, fluorine ion-implantation is carried out to the entire surface of the substrate (FIG. 5(b)). In this embodiment, the ion-implantation is made to both the p-MOS and n-MOS. The fluorine ion-implantation is made to the n-MOS to prevent the deterioration of the device characteristics due to hot electron effects. The hot electron effect is that electrons are accelerated by an electric field between the source and the drain and the accelerated electrons have high energy, and electrons and holes are generated by ionization of collision, whereby the accelerated electrons and the generated electrons and holes are implanted into the ate oxide film, and the characteristic of the MOS is changed. In the conventional MOS transistor, silicon in the channel region has an Si—H terminated structure having a weak bonding force, for which reason, the Si—H bonding is likely to be broken by collision of the channel carriers when driving the transistor. The breaking the Si—H bond causes interface state which cases hot electron effects. Once the hot electron effect is caused, a threshold voltage variation and a deterioration in mutual conductance $g_m$ are caused, resulting in a large drop of the device reliability. This problem is particularly remarkable for the n-MOS because the drain saturation current of the n-MOS is larger than the p-MOS. The hot electron effect is more remarkable when the gate length is shortened due to the scale down of the device and the high electric field is applied across the source and drain. The fluorine introduction is made to the n-MOS to solve the above problem and effectively prevent the threshold voltage variation and the deterioration in mutual conductance $g_m$.

The dose of the ion-implantation is preferably not less than $1\times10^{13}$ cm$^{-2}$, and more preferably not less than $5\times10^{13}$ cm$^{-2}$, and also preferably not more than $1\times10^{15}$ cm$^{-2}$, and more preferably not more than $5\times10^{14}$ cm$^{-2}$. If the excess amount of the fluorine is implanted, then a remarkable deterioration of the short channel characteristic is caused. If the less amount of the fluorine is implanted, then the Si—H bonds and dangling bonds in the silicon region are insufficiently substituted with fluorine, resulting in insufficient improvements in the slow trap characteristics of the p-MOS and also resulting in insufficient effect of suppressing the threshold voltage variation and the deterioration in mutual conductance $g_m$. It is preferable that the acceleration voltage is not less than 10 keV and not more than 30 keV. If the acceleration voltage is too large, then a large amount of inter-lattice silicon atoms is generated upon an ion-implantation thereby making it difficult to obtain the desired impurity profile in the formations of the source and drain regions. If the acceleration voltage is too low, then an insufficient amount of the fluorine is introduced, thereby obtaining insufficient improvement in the slow trap characteristic of the p-MOS and insufficient effect of suppressing the threshold voltage variation and the deterioration in mutual conductance $g_m$.

After the fluorine ion-implantation, similarly to the first embodiment, first and second heat treatments are carried out (FIG. 5(c)). The first heat treatment is to decay inter-lattice silicon atoms generated on the substrate surface due to the fluorine ion implantation. For example, the lamp anneal such as RTA is carried out at 900–1100° C., and preferably 900–1000° C., for about 5 seconds to 2 minutes. The second heat treatment is to diffuse the fluorine into the channel region under the gate electrode. The temperature is preferably not less than 600° C., and more preferably not less than 650° C., and also preferably not more than 850° C., and more preferably not more than 800° C. If the temperature is too low, then the substitution with fluorine is insufficient, and the effect for improvement in the slow trap characteristics is insufficient. If the temperature is too high, then the impurity for adjusting the threshold voltage is diffused together with the fluorine diffusion, whereby the threshold voltage may vary.

As shown in FIG. 5(b), the photo-resist 3 is provided on the n-MOS formation region. An ion-implantation of p-type impurity into the p-MOS formation region is carried out to form source and drain extension regions 16. The photo-resist 3 remains and the ion-implantation of the n-type impurity is carried out to form the pocket regions 17.

Thereafter, similarly to the first embodiment, the processes as shown in FIGS. 3–4 are carried out to complete the CMOS. In the step of FIG. 3(c) for forming the source and drain regions, it is preferable that the dose of the n-type impurity and the acceleration voltage are blow the predetermined values. If arsenic is used, it is preferable that the dose is not more than $4\times10^{15}$ m$^{-2}$, and the acceleration voltage is not more than 30 keV, so that in the next step, the cobalt silicides 27 are formed over the diffusion layers and the gate electrode with preventing the deterioration of the surface shape ad the increase in the resistance.

(Third Practicable Mode)

This embodiment comprises the similar processes to the first embodiment but is different from the second embodiment in the timing of carrying out the anneal after the fluorine implantation. The descriptions will be made with reference to FIG. 6.

Similarly to the first embodiment, the processes shown in FIG. 1 are carried out. Next, as shown in FIG. 6(a), a photo-resist 3 is provided on a p-MOS formation region. An ion-implantation of n-type impurity into an n-MOS formation region is carried out to form source and drain extension regions 13. The photo-resist 3 remains and an ion-implantation of p-type impurity is carried out to form pocket regions 14. Thereafter, a heat treatment for example RTA is carried out for removing inter-lattice silicon atoms.

After the photo-resist 3 is removed, a photo-resist 3 is provided on the n-MOS formation region to carry out an ion-implantation of fluorine (FIG. 6(b)), thereby forming fluorine-implanted regions 10 over the substrate. Preferable ranges for fluorine ion-implantation conditions and the reasons therefor are the same as described in the first embodiment.

As shown in FIG. 6(c), a photo-resist 3 is provided on an n-MOS formation region for carrying out an ion-implantation of p-type impurity into the p-MOS formation region to form source and drain extension regions 16. The photo-resist 3 remains and an ion-implantation of n-type impurity to form pocket regions 17.

After the fluorine implantation, similarly to the second embodiment, first and second heat treatments are carried out (FIG. 6(d)). Preferable ranges of heat treatment conditions and the reasons therefor are the same as described in the first embodiment.

Processes shown in FIG. 3 similarly to the first embodiment are carried out to complete CMOS.

(Fourth Embodiment)

In the first to third embodiments, the fluorine ion-implantation is carried out for improvement in the slow trap characteristics before the side walls of the gate electrode are formed. In this embodiment, after the side walls are formed, then the fluorine ion-implantation is carried out. The description will be made with reference to FIGS. 7–9.

Similarly to the first embodiment, processes shown in FIG. 1 are carried out. As shown in FIG. 7(a), a photo-resist 3 is provided on a p-MOS formation region. An n-type impurity is ion-implanted into the n-MOS formation region to form source and drain extension regions 13. A photo-resist 3 remains and a p-type impurity is ion-implanted to form pocket regions 14. As shown in FIG. 7(b), a photo-resist 3 is provided on the n-MOS formation region to carry out an ion-implantation of p-type impurity into the p-MOS formation region, thereby forming source and drain extension regions 16. The photo-resist 3 remains and an ion-implantation of n-type impurity is carried out to form pocket regions 17.

In FIG. 7(a), it is preferable for forming the source and drain extension regions that the dose of the n-type impurity and the accelerated voltage are kept below the predetermined values. If arsenic is used, it is preferable that the dose is below 4×10$^{15}$ cm$^{-2}$, or the accelerated voltage is not more than 30 keV, so that, in the later process, cobalt silicides 27 are formed over the diffusion layers and the gate electrode with preventing the deterioration of the surface shape of the cobalt silicide and the increase in the resistance.

Next, side walls 18 and side walls 19 are provided to the gate electrode 20 and the gate electrode 21 respectively (FIG. 8(a)). After the photo-resist 3 is provided on the p-MOS formation region, then the ion-implantation of n-type impurity into the n-MOS region to form source and drain regions 23 and also introduce impurity into the gate electrode 21 concurrently (FIG. 8(b)).

In FIG. 8(b), it is preferable for forming the source and drain regions 23 that the dose of the n-type impurity and the acceleration voltage are kept below predetermined values. If the arsenic is used, it is preferable that the dose is not more than 4×10$^{15}$ cm$^{-2}$ or the acceleration voltage is not more than 30 keV. In the later process, cobalt silicides 27 are formed over the diffusion layers and the gate electrode with preventing the deterioration in surface shape of the cobalt silicide and the increase in the resistance.

After the impurity introduction is carried out to form the source and drain region in the n-MOS formation region, subsequently a photo-resist 3 is provided on the n-MOS formation region for carrying out an ion-implantation of p-type impurity into the p-MOS formation region, whereby the source and drain regions 22 are formed and concurrently the impurity is introduced into the gate electrode 20 (FIG. 8(c)). Born (B$^+$) and boron fluoride (BF$_2^+$) are available as the p-type impurity. As described in the first embodiment, the use of boron causes the remarkable effect of the invention.

After the photo-resist 3 is peeled, then the heat treatment is carried out for activating the impurity in the source and drain regions 22 and 23. The heat treatment is carried out by RTA at 900–1100° C. for about 5 seconds to 1 minute.

Subsequently, the fluorine ion-implantation is carried out (FIG. 9(a)). In this embodiment, the ion-implantation is carried out to both the p-MOS and n-MOS regions. The fluorine ion-implantation is carried out to the n-MOS region to prevent the device performances due to the hot electron effects. The preferable range for ion-implantation conditions and the reasons therefor are the same as described in the second embodiment.

After the fluorine is ion-implanted, similarly to the first to third embodiments, first and second heat treatments are carried out (FIG. 9(b)). The preferable range for ion-implantation conditions and the reasons therefor are the same as described in the second embodiment.

Thereafter, similarly to the first embodiment, processes shown in FIG. 4 are carried out to complete CMOS.

(Fifth Practicable Mode)

In this embodiment, the processes are similar to the fourth embodiment but different in fluorine ion-implantation with the residual resist used in the source and drain formation of the p-MOS and also in the first heat treatment carried out for the purpose of extinction of the inter-lattice silicon atoms generated on the substrate surface upon the fluorine ion-implantation and also for activating the source and drain. In view of this, the processes of this embodiment is intended to be simplified. In this embodiment, similarly to the third embodiment, fluorine ions are implanted after the side walls are formed. The descriptions will be made with reference to the drawings.

As shown in FIG. 10(a), field oxide films 2 are formed over a silicon substrate 1 before a photo-resist 3 is provided on the n-MOS formation region. An n-type impurity such as phosphorous is ion-implanted into the p-MOS formation region to form n-well 4. Subsequently, the photo-resist 3 remains and an impurity is implanted to adjust a threshold voltage.

As shown in FIG. 10(b), a photo-resist 3 is provided on the p-MOS formation region for carrying out an ion-implantation of p-type impurity into the n-MOS formation region, thereby forming a p-well 6. Subsequently, the photo-resist 3 remains and an impurity is implanted to adjust a threshold voltage.

After a gate insulating film 7 is formed on an active region, a gate electrode material is deposited. For the gate insulating film, there are available a silicon oxide film, a silicon oxo-nitride film, or a ferro-dielectric film such as a tantalum oxide film. In this embodiment, a polycrystalline silicon 8 is used for the gate electrode material. It is not necessary to limit this material. A tungsten-containing film or laminations of the tungsten-containing film and the polycrystalline silicon is also available.

In this embodiment, it is preferable to reduce the thickness of the polycrystalline silicon 8 as compared to the first embodiment, for example, about 120–150 nm. The heat treatment is carried out for activating the source and drain and for extinction to the inter-lattice silicon atoms in the fluorine ion-implantation, for which reason a temperature of the heat treatment is set lower than the normal temperature. If the heat treatment temperature is lowered, then a depletion of the impurity in the gate electrode is prevented.

After the gate insulating film 7 and the gate electrode material are formed, then those are selectively etched to form a gate electrode (FIG. 10(c)). A gate length is optionally set. This method is particalrly effective when applied to the fabrication method for the MOS transistor containing the gate electrode of the gate length is, for example, not more than 0.18 micrometers, and particularly not more than 0.15 micrometers. In the transistor with the gate electrode of the gate length, a strict requirement for the short channel characteristics is necessary and the absolute value of the threshold voltage is lowered, whereby the problem with the slow trap is remarkable.

As shown in FIG. 11(a), a photo-resist 3 is provided on the p-MOS formation region for carrying out the ion-implantation of n-type impurity into the n-MOS formation region, thereby to form source and drain extension regions 13. Subsequently, the photo-resist 3 remains and the p-type impurity is ion-implanted to form pocket regions 14.

As shown in FIG. 11(b), a photo-resist 3 is provided on the n-MOS formation region to carry out an ion-implantation of p-type impurity into a p-MOS formation region, thereby forming source and drain extension regions 16. The photo-resist 3 remains and an ion-implantation of n-type impurity is carried out to form pocket regions 17.

Next, side walls 18 and side walls 19 are provided to the gate electrode 20 and the gate electrode 21 (FIG. 12(a)). After a photo-resist 3 is provided on the p-MOS formation region, an ion-implantation of n-type impurity into the n-MOS formation region is carried out to form source and drain regions 23 and introduce the impurity into the gate electrode 21 (FIG. 12(b)).

After the photo-resist 3 is provided on the n-MOS formation region, an ion-implantation of p-type impurity is carried out to form a p-MOS formation region to form source and drain regions 22 and introduce the impurity into the gate electrode 20 concurrently (FIG. 12(c)). Boron (B$^+$) and boron fluoride (BF$_2^+$) are available. As described in the first embodiment, the effect of the present invention is remarkable when boron is used.

The photo-resist 3 remains and the fluorine ion-implantation is carried out (FIG. 13(a)). At this point, the present process is different from the fourth embodiment, wherein the fluorine ion-implantation is carried out after the photo-resist 3 is peeled. In this embodiment, after the photo-resist 3 is peeled, then the heat treatment for activating the impurity in the source and drain regions 22 and 23 are not carried out. In this point, the present process is different from the fourth embodiment.

The referable range of fluorine ion implantation condition is the same as described in the second embodiment. After the fluorine ion-implantation, first and second heat treatments are carried out (FIG. 13(b)). The first heat treatment is also for activating the source and drain. For the first heat treatment, a temperature is about 900–950° C., and a RTA is used. The preferable range of the second heat treatment condition is the same as described in the second embodiment.

Thereafter, processes shown in FIG. 4 similarly to the first embodiment are carried out to complete the CMOS.

(Sixth Practicable Mode)

The present embodiment has the similar processes to the fourth embodiment but different in a fluorine ion-implantation carried out before the ion-implantation is carried out to form source and drain regions after the side walls are formed.

Similarly to the first embodiment, the processes shown in FIG. 1 are carried out. Similarly to the fourth embodiment, processes shown in FIG. 7 are further carried out, thereby forming source and drain extension regions 13 and 16 and pocket regions 14 and 17.

As shown in FIG. 14(a), side walls 18 and side walls 19 are provided for the gate electrode 20 and the gate electrode 21. An ion-implantation of fluorine is carried out to the entire surface (FIG. 14(b)). Thereafter, first and second heat treatments are carried out (FIG. 14(c)). The preferable ranges for the fluorine ion implantation and the heat treatment are the same as described in the second embodiment.

After the photo-resist 3 is provided on the p-MOS formation region, an ion-implantation of n-type impurity into the n-MOS formation region is carried out to form source and drain regions 23 and introduce the impurity into the gate electrode 21 concurrently (FIG. 15(a)). After the photo-resist 3 is provided on the n-MOS formation region before the ion-implantation of the p-type impurity into the p-MOS formation region is carried out to form source and drain regions 22 and introduce the impurity into the gate electrode 20 (FIG. 15(b)). Boron ($B^+$) and boron fluoride ($BF_2^+$) are available as the p-type impurity. As described in the first embodiment, the use of boron causes the remarkable effect of the present invention.

The photo-resist 3 is peeled and a heat treatment is carried out for activating the impurity in the source and drain regions 22 and 23. This heat treatment is carried out by RTA and at 900–1100° C. for about 5 seconds to 1 minute.

Similarly to the first embodiment, the processes shown in FIG. 4 are carried out to complete the CMOS.

It is preferable that the dose of the n-type impurity and the acceleration voltage are kept blow the predetermined levels for forming the source and drain extension regions 13 in FIG. 7(a) and for forming the source land drain regions 23 in FIG. 15(a). If arsenic is used, the dose is preferably below $4\times10^{15}$ cm$^{-2}$ or the acceleration voltage is not more than 30 keV, so that the cobalt silicide 27 is formed over the diffusion layers and the gate electrode with preventing the deterioration of the surface shape of the cobalt silicide and the increase in the resistance.

In the first to sixth embodiments described above, the fluorine ion-implantation is carried out in various steps after the gate electrode is formed. In any of the embodiments, the following processes (a)–(c) are included.

(a) process for forming gate electrode;

(b) process for forming side walls; and (c) process for ion-implantation to form source and drain.

In the first to third embodiments, the fluorine ion-implantation is carried out between the processes (a) and (b). In the fourth and fifth embodiments, the fluorine ion-implantation is carried out after the process (c). In the sixth embodiment, the fluorine ion-implantation is carried out between the processes (b) and (c).

A fluorine is efficiently diffused to the entire region directly under the gate insulating film. In view of the generation of the fluorine bonding, it is preferable to carry out the fluorine ion-implantation before the side wall formation. Namely, after the second heat treatment for diffusing the fluorine, side walls are formed on the sides of the gate electrode before the ion-implantation of the impurity is carried out to form the source and drain regions. The process for ion-implantation of impurity to form the source and drain regions is, for example, the process pf FIG. 3(b) in the first embodiment and is different from the impurity introducing process for forming the source and drain extension regions. If the fluorine ion implantation is carried out before the side walls are provided, the fluorine is introduced into the adjacent positions to the channel region directly under the gate insulating film as compared to when the fluorine ion implantation is carried out after the side walls are provided. A uniform distribution of fluorine over the entire of the channel region can be obtained. Before the source and drain are formed, the first heat treatment for extinction to the inter-lattice silicon atoms and the second heat treatment for diffusing the fluorine are carried out to prevent those heat treatments from providing any influences to the impurity concentration profiles of the source and drain regions.

After the side walls are formed in the process (b), the fluorine ion-implantation is carried out, whereby it is somewhat disadvantageous to obtain uniform distribution of fluorine over the entire of the channel region, but it is possible to omit the process for forming the resist mask and carrying out the heat treatment to simplifying the processes.

EMBODIMENTS

Embodiment 1

The present embodiment is to apply the present invention to the CMOS fabrication processes. The description will be made with reference to FIGS. 1–4. The heat treatment temperature mentioned below is the temperature hen measuring the substrate temperature by a non-contact measurement for example pyrometer.

As shown in FIG. 1(a), a shallow trench isolation 2 is formed over a silicon substrate 1. A photo-resist 3 is provided on an n-MOS formation region for carrying out an ion-implantation of phosphorus into a p-MOS formation region, thereby forming an n-well 4. The photo-resist 3 remains and an ion-implantation of As is carried out for adjusting a threshold voltage. The conditions for the ion-implantation is that the acceleration voltage is 100 keV and the dose is $6\times10^{12}$ cm$^{-2}$.

As shown in FIG. 1(b), a photo-resist 3 is provided on the p-MOS formation region for carrying out an ion-implantation of boron into the n-MOS formation region to form a p-well region 6. The photo-resist 3 remains and an ion-implantation of boron is carried out for adjusting a threshold voltage. The conditions for the ion-implantation is that the acceleration voltage is 30 keV and the dose is $2\times10^{12}$ cm$^{-2}$.

A gate insulating film 7 comprising a silicon oxo-nitride film of 2.6 nm in thickness is formed over a substrate surface. The silicon oxo-nitride film is formed by the steps of forming a silicon oxide film and carrying out an anneal under NO atmosphere and further carrying out an oxidation. A polycrystalline silicon 8 of 150 nm in thickness is deposited on the gate insulating film 7, before the gate insulating film and the polycrystalline silicon 8 are selectively etched for patterning the same (FIG. 1(c). A gate length of each of the gate electrodes is 0.13 micrometers.

As shown in FIG. 2(a), a photo-resist 3 is provided on the p-MOS formation region to carry out an ion-implantation into the n-MOS formation region to form source and drain extension regions 13. Ion species is As, and the accelerated voltage is 2 keV and the dose is $5\times10^{14}$ cm$^{-2}$. The photo-resist 3 remains and the ion-implantation is carried out for forming pocket regions 14. This ion-implantation is carried out by a rotation implantation method with an incident angle of 30 degrees. Ion species if BF$_2$, and the accelerated voltage is 30 keV and the dose is $1.3\times10^{13}$ cm$^{-2}$. Thereafter, a heat treatment of RTA is optionally carried out for removing the inter-lattice silicon atoms.

A photo-resist 3 is provided on the p-MOS region before an ion-implantation of fluorine is carried out for improving the slow trap of the p-MOS (FIG. 2(b)). The implantation conditions are that the accelerated footage is 15 keV and the dose is $1\times10^{14}$ cm$^{-2}$. After the fluorine introduction, anneals are carried out two times. The first heat treatment is carried out by RTA at 950° C. for 10 seconds. This heat treatment causes extinction of the inter-lattice silicon atoms generated on the substrate surface upon the fluorine ion-implantation. The second heat treatment is a furnace anneal at 700° C. for 30 minutes. Fluorine is diffused into the channel region under the gate electrode and reaches the channel region directly under the gate insulating film, whereby Si-H bonds of silicon or dangling bonds are substituted with fluorine.

As shown in FIG. 2(d), a photo-resist 3 is provided on the n-MOS formation region for carrying out an ion-implantation into the p-MOS formation region, to form source and drain extension regions 16. Ion species if BF$_2$, and the accelerated voltage is 2.5 keV and the dose is $5\times10^{14}$ cm$^{-2}$. The photo-resist 3 remains and the ion-implantation is carried out for forming pocket regions 17. This ion-implantation is carried out by a rotation implantation method with an incident angle of 30 degrees. Ion species is As, and the accelerated voltage is 80 keV and the dose is $1.5\times10^{13}$ cm$^{-2}$.

The photo-resist 3 is peeled before side walls 18 of silicon oxide films and side walls 19 of silicon oxide films are provided for the gate electrode 20 and the gate electrode 21 (FIG. 3(a)). A photo-resist 3 is provided on the n-MOS formation region for carrying out the ion-implantation of boron into the p-MOS formation region to form source and drain regions 22 and introduce the impurity into the gate electrode 20 concurrently (FIG. 3(b)). The implantation conditions are that the accelerated voltage is 5 keV and the dose is $5\times10^{15}$ m$_{-2}$. Thereafter, the RTA is carried out in a nitrogen atmosphere at 1000° C. for 10 seconds to activate the impurity in the source and drain regions at the gate electrode.

A cobalt film of 10 nm in thickness is entirely deposited by a sputtering method over the substrate for subsequent heat treatment to form a cobalt silicide 27 (FIG. 4(a)). The cobalt silicide 27 is formed over the gate electrode and the source and drain regions. A thickness of the cobalt silicide 27 is about 35 nm.

A BPSG film 28 as an inter-layer insulator is deposited entirely and then contact holes are formed. A barrier metal film of Ti/TiN and a tungsten film are formed to fill the contact holes before a CMP is carried out to form tungsten plugs 29 (FIG. 4(b)). Upper level interconnections are formed in the known techniques to complete the CMOS.

COMPARATIVE EXAMPLE 1

The CMOS is fabricated almost similarly to the embodiment 1 except for having not carried out the processes of FIGS. 2(b–c) and having not carried out the fluorine introduction.

For the p-MOS of the CMOS in each of the embodiment 1 and the comparative example 1, the anti-slow trap characteristic is evaluated.

The evaluation is carried out by measuring the variation in threshold voltage Vth when the device is placed in an atmosphere of 200° C. If the device is placed in the high temperature atmosphere, dangling bonds are likely to be formed in the gate insulating film and the channel region, whereby the slow trap generation is promoted, resulting in a large variation in threshold voltage. This evaluation of this embodiment is an acceleration test of the anti-slow trap characteristics. The evaluation result is shown in FIG. 20. The embodiment 1 is smaller in the variation (Δ Vth) of the threshold voltage as compared to the comparative example 1. This means that the slow trap is suppressed.

Silicide surface shapes over the n-MOS source and drain regions of the embodiment 1 are verified. FIG. 21 shows a result, wherein a vertical axis represents percentage of non-defective products and a lateral axis represents the number of wafers as processed.

As can be seen from FIG. 21, no deterioration on the silicon surface is caused for each wafer independently from the number of the processed wafers. Namely, since the fluorine ions are not implanted into the source and drain regions of the n-MOS formation region, no suppression to the silicidation reaction is caused.

Embodiment 2

This embodiment is to show an example for applying the present invention to the CMOS fabrication process through the similar processes to the example 1. In example 1, the ion-implantation of fluorine for improvement in the slow trap is carried out to only the p-MOS formation region at the acceleration voltage of 15 keV and the dose of $1\times10^{14}$ m$^{-2}$. In this embodiment, immediately after the gate patterning process FIG. 1(c), the ion-implantation of fluorine is carried out under the acceleration voltage of 15 keV and the dose of $3\times10^{15}$ m$_{-2}$. In example 1, the ion-implantation of arsenic for forming the source and drain of the n-MOS (FIG. 3(c)) is carried out at the acceleration voltage of 30 keV and the dose of $6\times10^{15}$ m$^{-2}$. In this embodiment, the ion-implantation of fluorine is carried out under the acceleration voltage of 50 keV and the dose of $1\times10^{15}$ m$^{-2}$.

COMPARATIVE EXAMPLE 2-1

In the processes of the above example 2, the arsenic ion-implantation for forming the source and drain of the n-MOS is carried out under the acceleration voltage of 50 keV and the dose of $6\times10^{15}$ m$^{-2}$ to form the CMOS.

In the processes of the above comparative example 2—2, the fluorine ion-implantation is carried out after the arsenic ion-implantation for forming the source and drain of the n-MOS to form the CMOS. Namely, the photo-resist 3 is removed from the state of FIG. 3(c), before the fluorine ion-implantation is carried out.

Silicide surface shapes over the n-MOS source and drain regions for each wafer of the embodiment 2 and the comparative examples 2-1 and 2—2 are verified. FIG. 22 shows a result, wherein a vertical axis represents percentage of non-defective products and a lateral axis represents the number of wafers as processed. The dose of the accerlation voltage to the n-MOS region in each of the embodiment 2 and the comparative examples 2-1 and 2—2 are shown on table 1

As can be seen from FIG. 22, the wafer of the embodiment 2 is free from the surface defective over the silicon substrate onto which cobalt is sputtered, which is independent from the number of the processed wafers.

By contrast, the wafer of the comparative example 2-1 has the surface defective over the silicon substrate onto which cobalt is sputtered, which is independent from the number of the processed wafers. After the fluorine is implanted, a large amount of arsenic is implanted to break a large number of Si—Si bonds adjacent to the silicon substrate surface. Those are bonded with the residual fluorine in the substrate to form Si-F bonds having a larger bonding energy adjacent to the surfaces of the source and drain regions of the n-MOS, thereby suppressing reaction of cobalt with silicon, resulting in that a part of the silicide film is eluted into an etchant in the process for removing the unreacted metal over the side wall spacers.

The wafer of the comparative example 2—2 has a surface defective of the silicon substrate surface on which cobalt is sputtered because if arsenic is implanted to cut a large number of Si—Si bonds adjacent to the surface before the fluorine is implanted, then a larger amount of fluorine is consumed for bonding with the dangling bonds of the silicon atoms.

For the p-MOS in each of the embodiment 2 and the comparative examples 2-1 and 2—2, the anti-slow trap characteristic is evaluated.

The evaluation is carried out by measuring the variation in threshold voltage Vth when the device is placed in an atmosphere of 200° C. The evaluation result is shown in FIG. 20. Only the comparative example 2—2 has a large variation in threshold voltage because the effect of repairing the dangling bonds on the interface of the gate oxide film is small due to the fluorine ion-implantation after the side wall spacers are formed.

EXAMPLE 3

This embodiment is to show an example for applying the present invention to the CMOS fabrication process through the similar processes to the example 1. In example 1, the ion-implantation of fluorine for improvement in the slow trap is carried out to only the p-MOS formation region at the acceleration voltage of 15 keV and the dose of $1 \times 10^{14}$ m$^{-2}$. In this embodiment, immediately after the gate patterning process FIG. 1(c), the ion-implantation of fluorine is carried out under the acceleration voltage of 15 keV and the dose of $3 \times 10^{15}$ m$^{-2}$.

COMPARATIVE EXAMPLE 3-1

In the processes of the above example 3, the arsenic ion-implantation for forming the source and drain of the n-MOS is carried out under the acceleration voltage of 50 keV and the dose of $6 \times 10^{15}$ M$^{-2}$ to form the CMOS.

COMPARATIVE EXAMPLE 3-2

In the processes of the above comparative example 3-1, the fluorine ion-implantation is carried out after the arsenic ion-implantation for forming the source and drain of the n-MOS to form the CMOS.

Silicide surface shapes over the n-MOS source and drain regions for each wafer of the embodiment 3 and the comparative examples 3-1 and 3-2 are verified. FIG. 24 shows a result, wherein a vertical axis represents percentage of non-defective products and a lateral axis represents the number of wafers as processed. The dose and the acceleration voltage to the n-MOS region in each of the embodiment 3 and the comparative examples 3-1 and 3-2 are shown on table 1.

As can be seen from FIG. 24, the wafer of the embodiment 3 is free from the surface defective over the silicon substrate onto which cobalt is sputtered, which is independent from the number of the processed wafers. By contrast, the wafer of the comparative example 3-1 has the surface defective over the silicon substrate onto which cobalt is sputtered, which is independent from the number of the processed wafers. After the fluorine is implanted, arsenic is implanted at a high acceleration voltage to break a large number of Si—Si bonds in a vertical direction adjacent to the silicon substrate surface. Those are bonded with the residual fluorine in the substrate to form Si-F bonds having a larger bonding energy adjacent to the surfaces of the source and drain regions of the n-MOS, thereby suppressing reaction of cobalt with silicon, resulting in that a part of the silicide film is eluted into an etchant in the process for removing the reacted metal over the side wall spacers.

The wafer of the comparative example 3-2 has a surface defective of the silicon substrate surface on which cobalt is sputtered because if arsenic is implanted to cut a large number of Si—Si bonds adjacent to the surface before the fluorine is implanted, then a larger amount of fluorine is consumed for bonding with the dangling bonds of the silicon atoms.

For the p-MOS in each of the embodiment 3 and the comparative examples 3-1 and 3-2, the anti-slow trap characteristic is evaluated.

The evaluation is carried out by measuring the variation in threshold voltage Vth when the device is placed in an atmosphere of 200° C. The evaluation result is shown in FIG. 25. Only the comparative example 3-2 has a large variation in threshold voltage because the effect of repairing the dangling bonds on the interface of the gate oxide film is small due to the fluorine ion-implantation after the side wall spacers are formed.

TABLE 1

| | source drain extension region | | source drain region | |
|---|---|---|---|---|
| | dose ($\times 10^{15}$ cm$^{-2}$) | acceleration (keV) | dose ($\times 10^{15}$ cm$^{-2}$) | acceleration (keV) |
| Ex. 1 | 0.5 | 2 | 6 | 30 |
| Ex. 2 | 0.5 | 2 | 1 | 50 |
| Comp Ex. 2-1 | 0.5 | 2 | 6 | 50 |
| Comp Ex. 2-2 | 0.5 | 2 | 6 | 50 |
| Ex. 3 | 0.5 | 2 | 6 | 30 |

TABLE 1-continued

|  | source drain extension region | | source drain region | |
|---|---|---|---|---|
|  | dose ($\times 10^{15}$ cm$^{-2}$) | acceleration (keV) | dose ($\times 10^{15}$ cm$^{-2}$) | acceleration (keV) |
| Comp Ex. 3-1 | 0.5 | 2 | 6 | 50 |
| Comp Ex. 3-2 | 0.5 | 2 | 6 | 50 |

EFFECT OF THE INVENTION

As described above, in accordance with the present invention, after the fluorine ion-implantation is carried out, the heat treatment is carried out in two steps for efficiently substituting silicon terminals with florins in the channel regions for suppressing the slow trap and improvement in a long-term reliability of the transistor.

In accordance with the present invention, the fluorine ion is not implanted into the gate electrode and the diffusion layers of the n-MOS, over which the refractory metal silicide is formed in the later process, for obtaining a good silicide surface shape. Unwillingly, if the fluorine ions are implanted into the gate electrode an the diffusion layers of the n-MOS, then small atomic weight species for the ion-implantation is selected for forming the n-MOS or a small dose of the ion-implantation is selected, or a small acceleration voltage is selected to obtain a good silicide surface shape.

DESCRIPTIONS OF THE DRAWINGS

FIGS. 1a–c are process sectioned views of fabrication method of MOS transistor of the present invention.

FIGS. 2a–d are process sectioned views of fabrication method of MOS transistor of the present invention.

FIGS. 3a–c are process sectioned views of fabrication method of MOS transistor of the present invention.

FIGS. 4a–b are process sectioned views of fabrication method of MOS transistor of the present invention.

FIGS. 5a–d are process sectioned views of fabrication method of MOS transistor of the present invention.

FIGS. 6a–d are process sectioned views of fabrication method of MOS transistor of the present invention.

FIGS. 7a–b are process sectioned views of fabrication method of MOS transistor of the present invention.

FIGS. 8a–c are process sectioned views of fabrication method of MOS transistor of the present invention.

FIGS. 9a–b are process sectioned views of fabrication method of MOS transistor of the present invention.

FIGS. 10a–c are process sectioned views of fabrication method of MOS transistor of the present invention.

FIGS. 11a–b are process sectioned views of fabrication method of MOS transistor of the present invention.

FIGS. 12a–c are process sectioned views of fabrication method of MOS transistor of the present invention.

FIGS. 13a–b are process sectioned views of fabrication method of MOS transistor of the present invention.

FIGS. 14a–c are process sectioned views of fabrication method of MOS transistor of the present invention.

FIGS. 15a–b are process sectioned views of fabrication method of MOS transistor of the present invention.

FIGS. 16a–b are views of a structure of silicon terminal.

FIGS. 17a–c are process sectioned views of fabrication method of conventional MOS transistor.

FIGS. 18a–b are process sectioned views of fabrication method of conventional MOS transistor.

FIGS. 19a–c are process sectioned views of fabrication method of conventional MOS transistor.

FIG. 20 is a view of a slow trap improving effect by the present invention.

FIG. 21 is a view of an inter-relation of a non-defective percentage of silicide surface shape versus the number of processed wafers in accordance with the present invention.

FIG. 22 is a view of an inter-relation of a non-defective percentage of silicide surface shape versus the number of processed wafers in accordance with the present invention.

FIG. 23 is a view of a slow trap improving effect by the present invention.

FIG. 24 is a view of an inter-relation of a non-defective percentage of silicide surface shape versus the number of processed wafers in accordance with the present invention.

FIG. 25 is a view of a slow trap improving effect by the present invention.

DESCRIPTION OF THE REFERENCE NUMBERS

1 : silicon substrate
2 : isolation film
3 : photo-resist
4 : n-well
6 : p-well
7 : gate insulating film
8 : polycrystalline silicon
10 : fluorine ion-implanted region
12 : photo-resist
13 : source and drain extension regions
14 : pocket regions
15 : photo-resist
16 : source and drain extension regions
17 : pocket region
18 : side walls
19 : side walls
20 : gate electrode
21 : gate electrode
22 : source and drain regions
23 : source and drain regions
27 : cobalt silicide
28 : BPSG film
29 : tungsten plug

What is claimed is:

1. A method of forming an MOS transistor, comprising the steps of:

forming a gate electrode on a gate insulating film over a silicon substrate;

carrying out an ion-implantation of fluorine ions into at least a silicon substrate surface around said gate electrode, the fluorine ion implantation material being other than a fluorine-boron compound;

carrying out a first heat treatment to remove inter-lattice silicon atoms generated in said ion-implantation; and after said first heat treatment, carrying out a second heat treatment to diffuse said fluorine ions into a region directly under said gate insulating film.

2. The method of forming an MOS transistor as claimed in claim 1, characterized in that a heat treatment temperature of the second heat treatment is lower than a heat treatment temperature of the first heat treatment.

3. The method of forming an MOS transistor as claimed in claim 1, characterized in that the first heat treatment is a lamp anneal, and the second heat treatment is a furnace anneal.

4. The method of forming an MOS transistor as claimed in claim 1, characterized in that a heat treatment temperature of the first heat treatment is 900–1100° C.

5. The method of forming an MOS transistor as claimed in any one of claims 1–4, characterized in that a heat treatment temperature of the second heat treatment is 600–850° C.

6. The method of forming an MOS transistor as claimed in claim 1, characterized in that said MOS transistor is a p-type transistor.

7. The method of forming an MOS transistor as claimed in claim 1, characterized in that a dose of the fluorine ions is not less than $1\times10^{13}$ cm$^{-2}$ and not more than $1\times10^{15}$ cm$^{-2}$.

8. A method of forming a complementary MOS transistor, said method including the steps of:

forming an n-type MOS transistor and a p-type MOS transistor over a silicon substrate, wherein said p-type MOS transistor is formed by a method of claim 1, said method characterized by the steps of:

coating a part or an entire of an n-type MOS transistor formation region by a mask for subsequent ion-implantation of said fluorine ions; and forming refractory metal silicide layers both on at least a part of a surface of a gate electrode and diffusion layers forming the p-type MOS transistor and on at least a part of a surface of a gate electrode and diffusion layers forming the n-type MOS transistor.

9. A method of forming a complementary MOS transistor, said method including the steps of:

forming an n-type MOS transistor and a p-type MOS transistor over a silicon substrate, wherein said p-type MOS transistor is formed by a method of claim 1 and carrying out an ion-implantation of arsenic for forming diffusion layers and/or a gate electrode of said n-type MOS transistor, said method characterized in that:

a dose of said ion-implantation of arsenic is not more than $4\times10^{15}$ cm$^{-2}$, before refractory metal silicide layers are formed both on at least a part of a surface of a gate electrode and diffusion layers forming the p-type MOS transistor and on at least a part of a surface of a gate electrode and diffusion layers forming the n-type MOS transistor.

10. A method of forming a complementary MOS transistor, said method including the steps of:

forming an n-type MOS transistor and a p-type MOS transistor over a silicon substrate, wherein said p-type MOS transistor is formed by a method of claim 1 and carrying out an ion-implantation of arsenic for forming diffusion layers and/or a gate electrode of said n-type MOS transistor, said method characterized in that:

an acceleration voltage for said ion-implantation of arsenic is not more than 30 KeV, before refractory metal silicide layers are formed both on at least a part of a surface of a gate electrode and diffusion layers forming the p-type MOS transistor and on at least a part of a surface of a gate electrode and diffusion layers forming the n-type MOS transistor.

11. The method of forming a complementary MOS transistor as claimed in any one of claim 8, characterized in that a refractory metal for a component of said refractory metal silicide film is cobalt, nickel or iron.

12. A method of forming an MOS transistor, comprising the steps of:

forming a gate electrode on a gate insulating film over a silicon substrate;

carrying out an ion-implantation of fluorine ions into at least a silicon substrate surface around said gate electrode;

carrying out a first heat treatment to remove inter-lattice silicon atoms generated in said ion-implantation;

after said first heat treatment, carrying out a second heat treatment to diffuse said fluorine ions into a region directly under said gate insulating film;

after said second heat treatment, forming side walls on side faces of said gate electrode; and carrying out an ion-implantation of an impurity for forming source and drain regions.

* * * * *